(12) United States Patent
Lin et al.

(10) Patent No.: US 12,489,432 B2
(45) Date of Patent: *Dec. 2, 2025

(54) INTEGRATED CIRCUIT DEVICE, METHOD AND SYSTEM

(71) Applicant: TAIWAN SEMICONDUCTOR MANUFACTURING COMPANY, LTD., Hsinchu (TW)

(72) Inventors: Cheng-Yu Lin, Hsinchu (TW); Yung-Chen Chien, Hsinchu (TW); Jia-Hong Gao, Hsinchu (TW); Jerry Chang Jui Kao, Hsinchu (TW); Hui-Zhong Zhuang, Hsinchu (TW)

(73) Assignee: ASSIER CONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/624,868

(22) Filed: Apr. 2, 2024

(65) Prior Publication Data

US 2024/0250671 A1 Jul. 25, 2024

Related U.S. Application Data

(63) Continuation of application No. 17/825,704, filed on May 26, 2022, now Pat. No. 11,979,158.

(60) Provisional application No. 63/268,403, filed on Feb. 23, 2022.

(51) Int. Cl.
*H03K 3/00* (2006.01)
*H03K 3/012* (2006.01)
*H03K 3/037* (2006.01)
*H03K 3/356* (2006.01)
*H03K 3/3562* (2006.01)
*H03K 5/134* (2014.01)

(52) U.S. Cl.
CPC ......... *H03K 3/35625* (2013.01); *H03K 3/012* (2013.01); *H03K 3/0372* (2013.01); *H03K 3/356104* (2013.01); *H03K 5/134* (2014.07)

(58) Field of Classification Search
CPC .. H03K 3/35625; H03K 3/012; H03K 3/0372; H03K 3/356104; H03K 5/134; H03K 5/156
See application file for complete search history.

(56) References Cited

U.S. PATENT DOCUMENTS

| | | | |
|---|---|---|---|
| 9,966,936 B2 * | 5/2018 | Kim | ............. G01R 31/318541 |
| 2016/0241219 A1 | 8/2016 | Kim et al. | |
| 2017/0016955 A1 | 1/2017 | Kim et al. | |
| 2017/0236823 A1 | 8/2017 | Lee et al. | |
| 2018/0062625 A1 | 3/2018 | Agarwal et al. | |
| 2018/0145663 A1 | 5/2018 | Agarwal et al. | |

(Continued)

FOREIGN PATENT DOCUMENTS

| | | |
|---|---|---|
| CN | 109412557 | 3/2019 |
| TW | I487090 | 6/2015 |

*Primary Examiner* — Tuan T Lam
(74) *Attorney, Agent, or Firm* — Hauptman Ham, LLP

(57) ABSTRACT

An integrated circuit (IC) device includes a master latch circuit having a data output, a slave latch circuit having a data input electrically coupled to the data output of the master latch circuit, and a clock circuit electrically coupled to the master latch circuit and the slave latch circuit. The slave latch circuit is physically between the master latch circuit and at least a part of the clock circuit.

20 Claims, 30 Drawing Sheets

(56) References Cited

U.S. PATENT DOCUMENTS

| | | |
|---|---|---|
| 2019/0089338 A1 | 3/2019 | Kim et al. |
| 2020/0144267 A1 | 5/2020 | Lee et al. |
| 2020/0192997 A1 | 6/2020 | Kim et al. |
| 2020/0195237 A1 | 6/2020 | Lee et al. |
| 2020/0395923 A1* | 12/2020 | Kim ..................... H03K 19/20 |
| 2021/0119617 A1 | 4/2021 | Lee et al. |
| 2021/0194469 A1 | 6/2021 | Agarwai et al. |
| 2021/0247910 A1 | 8/2021 | Kim et al. |

* cited by examiner

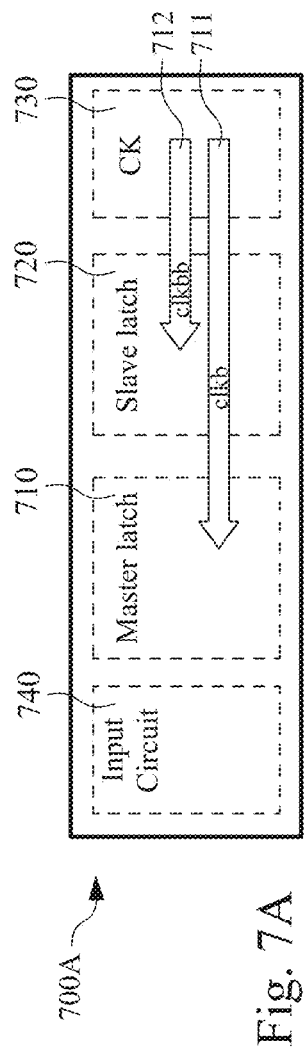
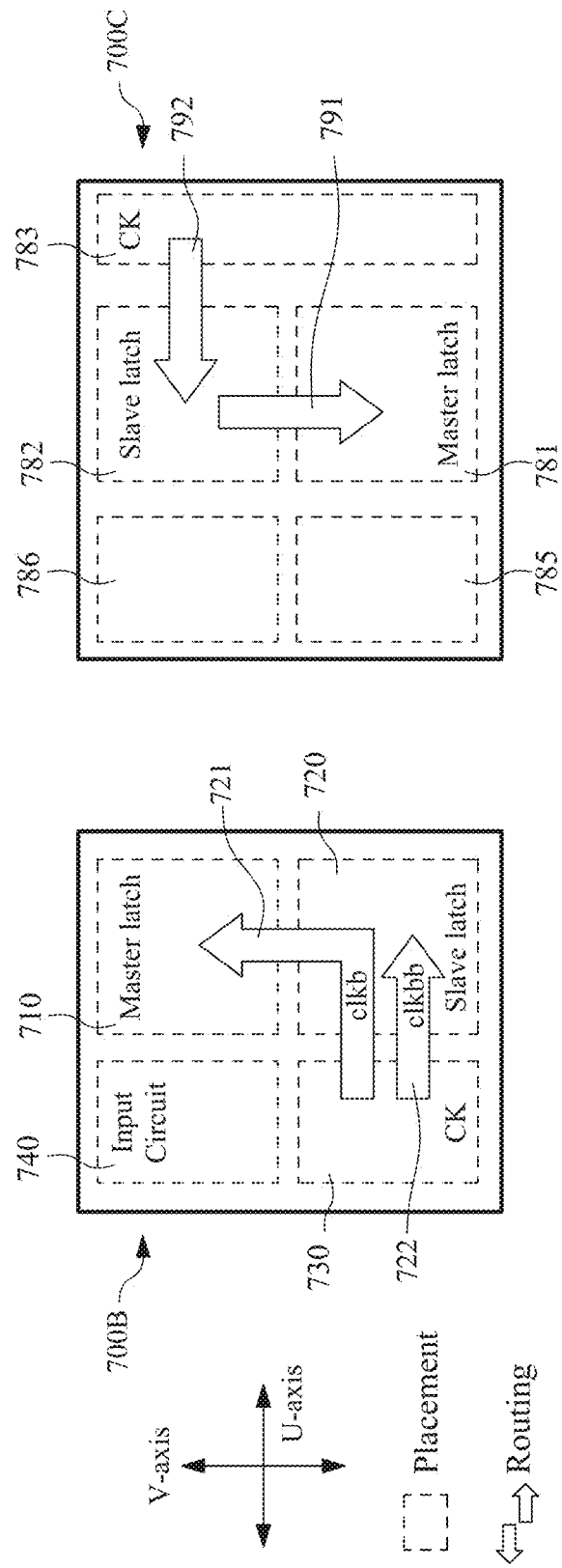
Fig. 7A
Fig. 7B
Fig. 7C

INTEGRATED CIRCUIT DEVICE, METHOD AND SYSTEM

RELATED APPLICATIONS

The instant application is a continuation of U.S. patent application Ser. No. 17/825,704, filed May 26, 2022, now U.S. Pat. No. 11,979,158, issued May 7, 2024, which claims the benefit of U.S. Provisional Application No. 63/268,403, filed Feb. 23, 2022. The above-listed applications and patent(s) are incorporated by reference herein in their entireties.

BACKGROUND

An integrated circuit ("IC") device includes one or more semiconductor devices represented in an IC layout (also referred to as "layout" or "layout diagram"). A layout is hierarchical and includes modules which carry out higher-level functions in accordance with the semiconductor device's design specifications. The modules are often built from a combination of cells, each of which represents one or more semiconductor structures configured to perform a specific function. Cells having pre-designed layouts, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. For example, a layout of an IC device is generated based on an IC design by a place-and-route operation in which various circuits or cells are placed in the layout and then routing is performed to define electrical connections among the circuits or cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7C are simplified schematic views of layouts of various circuit regions of one or more IC devices, in accordance with some embodiments.

DETAILED DESCRIPTION

Figure 1:
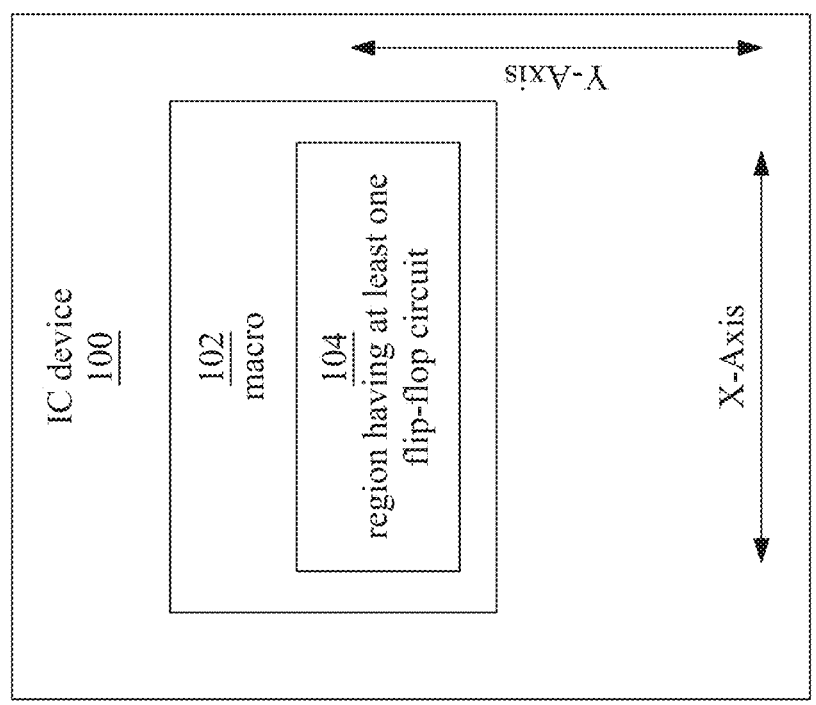
FIG. 1 is a block diagram of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flip-flop circuits (or flip-flops) are building blocks of digital electronics systems in computers, communications, or the like. A flip-flop circuit comprises a master latch circuit (or master latch), a slave latch circuit (or slave latch), and a clock circuit. The master latch circuit is configured to store (or latch) data input thereto, and pass the stored (or latched) data from a data output thereof to a data input of the slave latch circuit. The slave latch circuit is configured to store (or latch) the data received from the master latch circuit, and pass the stored (or latched) data to an output. The clock circuit is configured to control the timing of the master latch circuit and the slave latch circuit.

In some embodiments, a time delay from the clock circuit to the master latch circuit is increased to be greater than a time delay from the clock circuit to the slave latch circuit. In at least one embodiment, with a greater time delay from the clock circuit to the master latch circuit, a setup time of the flip-flop circuit is reduced which will result in an increase of the flop speed, i.e., the flip flop circuit will be operated faster. In some embodiments, the flop speed is increased by 1-10%. In one or more embodiments, the flop speed is increased by 5-15%. In some embodiments, by placing the master latch circuit, slave latch circuit and clock circuit in an IC layout in a specific physical arrangement and/or by performing routing among the placed master latch circuit, slave latch circuit and clock circuit with certain routing length relationships, it is possible to increase a time delay from the clock circuit to the master latch circuit to be greater than a time delay from the clock circuit to the slave latch circuit, thereby improving performance of IC devices manufactured based on the layout.

FIG. 1 is a block diagram of an IC device 100, in accordance with some embodiments.

In FIG. 1, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104, which comprises at least one flip-flop circuit. In some embodiments, the region 104 further comprises one or more other circuits or cells. Examples of circuits or cells in the region 104 include, but are not limited to, logic gate cells, memory cells, or the like. In some embodiments, examples of logic gate cells include, but are not limited to, AND, OR, NAND, NOR, XOR, INV, AND-OR-Invert (AOI), OR-AND-Invert (OAI), MUX, Flip-flop, BUFF, Latch, delay, clock cells, or the like. In some embodiments, examples of memory cells include, but are not limited to, static random access memory (SRAM), dynamic RAM (DRAM), resistive RAM (RRAM), magnetoresistive RAM (MRAM), read only memory (ROM), or the like. In some embodiments, a cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, and planar MOS transistors with raised sources/drains. Examples of passive elements include, but are not limited to, capacitors, inductors, fuses, and resistors. In some embodiments, the region 104 comprises a semiconductor substrate having circuitry formed thereon, in a front-end-of-line (FEOL) fabrication. Furthermore, above and/or below the semiconductor substrate, the region 104 comprises various metal layers that are stacked over and/or under insulating layers in a Back End of Line (BEOL) fabrication. The BEOL provides routing for circuitry of the IC device 100, including the macro 102 and the region 104. The metal layers comprise conductive patterns that extend along an X-axis or along a Y-axis transverse to the X-axis. The X-axis is sometimes referred to herein as a first direction or a second direction, and the Y-axis is sometimes referred to herein as the second direction or the first direction. In some embodiments, the first direction is orthogonal to the second direction.

Figure 2A:
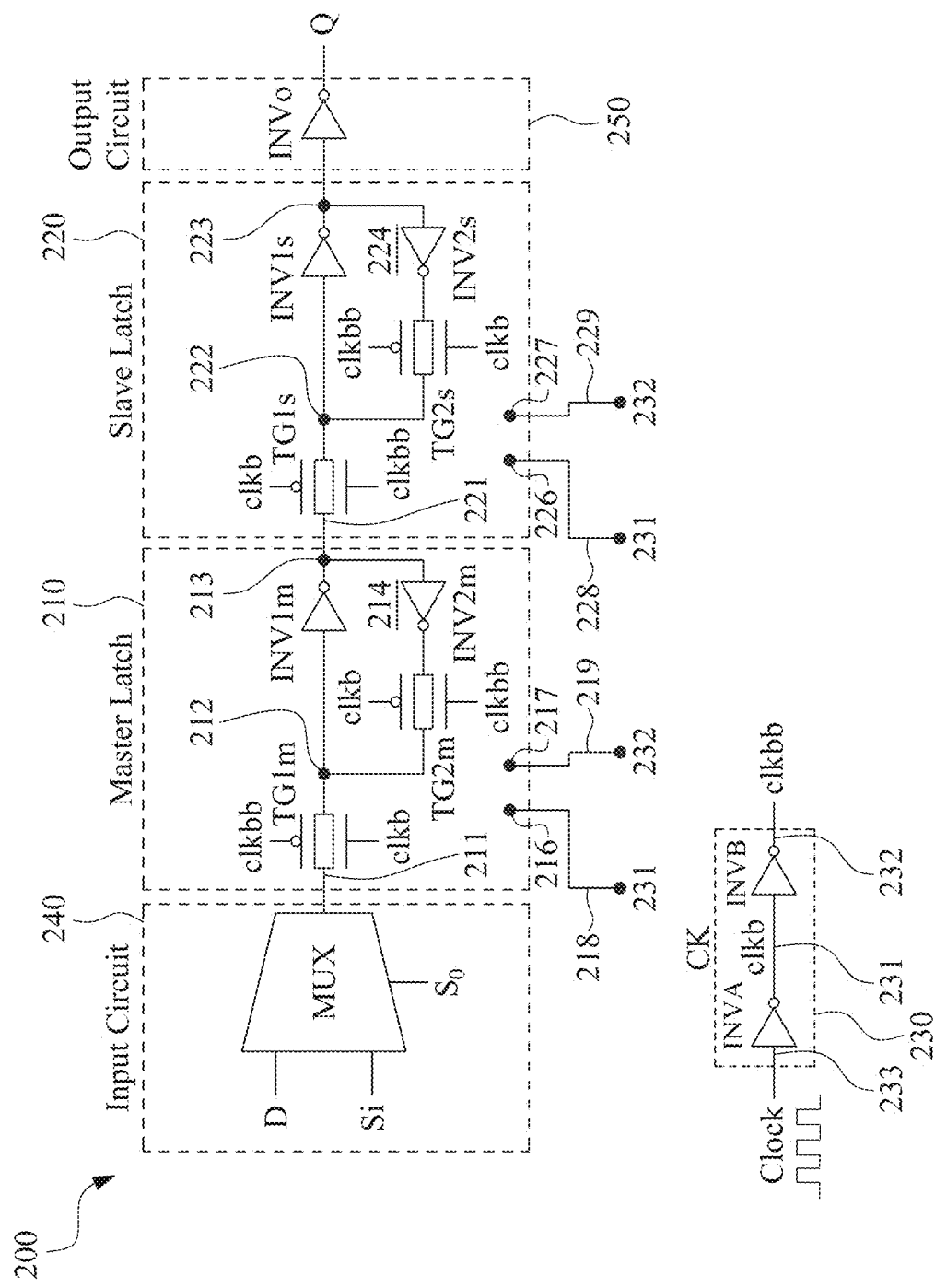
FIG. 2A is a schematic logic diagram of a flip-flop circuit, in accordance with some embodiments.

FIG. 2A is a schematic logic diagram of a flip-flop circuit 200, in accordance with some embodiments. Although the descriptions given herein with respect to FIG. 2A and one or more other figures are directed to flip-flop circuits, it is within the scopes of various embodiments that any circuit, which comprises a master latch circuit, a slave latch circuit and a clock circuit, is configurable to have a time delay from the clock circuit to the master latch circuit greater than a time delay from the clock circuit to the slave latch circuit, in accordance with some embodiments, for performance improvement. Further, the specific flip-flop circuit configuration described with respect to FIG. 2A is an example. Other flip-flop circuit configurations are within the scopes of various embodiments. For example, an alternative flip-flop circuit configuration is described with respect to FIG. 6.

In FIG. 2A, the flip-flop circuit 200 comprises a master latch circuit 210, a slave latch circuit 220, a clock circuit 230, an input circuit 240, and an output circuit 250. In some embodiments, the input circuit 240 and/or the output circuit 250 is/are omitted.

The master latch circuit 210 (designated in the figures with label "Master Latch") comprises a transmission gates TG1$m$, TG2$m$, inverters INV1$m$, INV2$m$, a data input 211, an intermediate node 212, and a data output 213. The transmission gate TG1$m$ is coupled between the data input 211 and the intermediate node 212. The transmission gate TG2$m$ is coupled between the intermediate node 212 and an output of the inverter INV2$m$. The inverter INV1$m$ has an input coupled to the intermediate node 212, and an output coupled the data output 213 of the master latch circuit 210. The inverter INV2$m$ has an input coupled to the data output 213 of the master latch circuit 210. The transmission gate TG2$m$ and the inverters INV1$m$, INV2$m$ together configure a data retention circuit 214 coupled to the transmission gate TG1$m$ at the intermediate node 212. The master latch circuit 210 further comprises a first clock input 216 coupled, by an electrical connection 218, to receive a first clock signal clkb from a clock output 231 of the clock circuit 230, and coupled to corresponding gates of the transmission gates TG1$m$, TG2$m$. The master latch circuit 210 further comprises a second clock input 217 coupled, by an electrical connection 219, to receive a second clock signal clkbb from a clock output 232 of the clock circuit 230, and coupled to corresponding further gates of the transmission gates TG1$m$, TG2$m$.

The slave latch circuit 220 (designated in the figures with label "Slave Latch") comprises a transmission gates TG1s, TG2s, inverters INV1s, INV2s, a data input 221, an intermediate node 222, and a data output 223. The data input 221 of the slave latch circuit 220 is coupled to the data output 213 of the master latch circuit 210. The transmission gate TG1s is coupled between the data input 221 and the intermediate node 222. The transmission gate TG2s is coupled between the intermediate node 222 and an output of the inverter INV2s. The inverter INV1s has an input coupled to the intermediate node 222, and an output coupled the data output 223 of the slave latch circuit 220. The inverter INV2s has an input coupled to the data output 223 of the slave latch circuit 220. The transmission gate TG2s and the inverters INV1s, INV2s together configure a data retention circuit 224 coupled to the transmission gate TG1s at the intermediate node 222. The slave latch circuit 220 further comprises a first clock input 226 coupled, by an electrical connection 228, to receive the first clock signal clkb from the clock output 231 of the clock circuit 230, and coupled to corresponding gates of the transmission gates TG1s, TG2s. The slave latch circuit 220 further comprises a second clock input 227 coupled, by an electrical connection 229, to receive the second clock signal clkbb from the clock output 232 of the clock circuit 230, and coupled to corresponding further gates of the transmission gates TG1s, TG2s. In at least one embodiment, the master latch circuit 210 and the slave latch circuit 220 have the same, identical configuration. In at least one embodiment, the electrical connection 218 has a greater physical length, and/or a greater time delay, than the electrical connection 228, and/or the electrical connection 219 has a greater physical length, and/or a greater time delay, than the electrical connection 229.

The clock circuit 230 (designated in the figures with label "CK") comprises inverters INVA, INVB, the clock output 231, the clock output 232, and a clock input 233. An input of the inverter INVA is coupled to the clock input 233 to receive an input clock signal Clock supplied to the clock input 233. An output of the inverter INVA is coupled to the clock output 231. The inverter INVA is configured to invert the input clock signal Clock to output the first clock signal clkb at the clock output 231. The clock output 231 is coupled to the first clock inputs 216, 226 of the master latch circuit 210 and slave latch circuit 220 to supply the first clock signal clkb to the master latch circuit 210 and slave latch circuit 220. An input of the inverter INVB is coupled to the clock output 231 to receive the first clock signal clkb. An output of the inverter INVB is coupled to the clock output 232. The inverter INVB is configured to invert the first clock signal clkb to output the second clock signal clkbb at the clock output 232. In other words, the second clock signal clkbb is inverted to the first clock signal clkb. The clock output 232 is coupled to the second clock inputs 217, 227 of the master latch circuit 210 and slave latch circuit 220 to supply the second clock signal clkbb to the master latch circuit 210 and slave latch circuit 220.

The input circuit 240 comprises a multiplexer MUX. The multiplexer MUX comprises a data input D, a scan-in input Si, a scan-enable input So, and an output (not numbered) coupled to the data input 211 of the master latch circuit 210. In some embodiments, in response to a first logic value at the scan-enable input So, data from the scan-in input Si are output to the master latch circuit 210. In response to a different, second logic value at the scan-enable input So, data from the data input D are output to the master latch circuit 210. The described configuration of the input circuit 240 is an example. Other configurations for the input circuit 240 are within the scopes of various embodiments. In an example, the input circuit 240 comprises an inverter instead of the multiplexer MUX. In another example, the input circuit 240 comprises a NAND gate instead of the multiplexer MUX. In at least one embodiment, the input circuit 240 is omitted, i.e., input data for the flip-flop circuit 200 are directly supplied to the data input 211 of the master latch circuit 210.

The output circuit 250 comprises an inverter INVo having an input coupled to the data output 223 of the slave latch circuit 220, and an output coupled to an output Q of the flip-flop circuit 200. The described configuration of the output circuit 250 is an example. Other configurations for the output circuit 250 are within the scopes of various embodiments. In at least one embodiment, the output circuit 250 is omitted, i.e., the data output 223 of the slave latch circuit 220 is directly coupled to the output Q of the flip-flop circuit 200.

The master latch circuit 210 and slave latch circuit 220 are configured to operate in accordance with the clock signals clkb, clkbb. In some embodiments, when the first clock signal clkb is at a logic high level and the second clock signal clkbb is at a logic low level, the transmission gates TG1m, TG2s are turned ON, and the transmission gates TG2m, TG1s are turned OFF. The turned ON transmission gate TG1m passes input data at the data input 211 to the intermediate node 212, and the input data are stored (or latched) as intermediate data by the data retention circuit 214, because the transmission gate TG2m is turned OFF. The turned ON transmission gate TG2s passes intermediate data previously stored (or latched) by the data retention circuit 224 in a preceding clock cycle to the output Q.

When the first clock signal clkb is at the logic high level and the second clock signal clkbb is at the logic low level, the transmission gates TG1m, TG2s are turned OFF, and the transmission gates TG2m, TG1s are turned ON. The turned ON transmission gates TG2m, TG1s pass the intermediate data stored (or latched) by the data retention circuit 214, through the data output 213 and data input 221, to the intermediate node 222 of the slave latch circuit 220. The transmission gate TG2s is turned OFF, and the intermediate data are stored (or latched) by the data retention circuit 224, for output to the output Q in a subsequent clock cycle.

In the example configuration in FIG. 2A, the flip-flop circuit 200 is a D flip-flop. Other flip-flop configurations including, but not limited to, SR flip-flop, JK flip-flop, delay flip-flop, toggle flip-flop, or the like, are within the scopes of various embodiments. In some embodiments, the flip-flop circuit 200 and/or any other flip-flop circuits described herein are included in an IC device to build one or more circuits including, but not limited to, memories, shift registers, analog-to-digital converters (ADC), digital-to-analog (DAC) converters, counters, clocks, registers or cache in microprocessors or central processing units to temporarily store information, or the like.

Figure 2B:
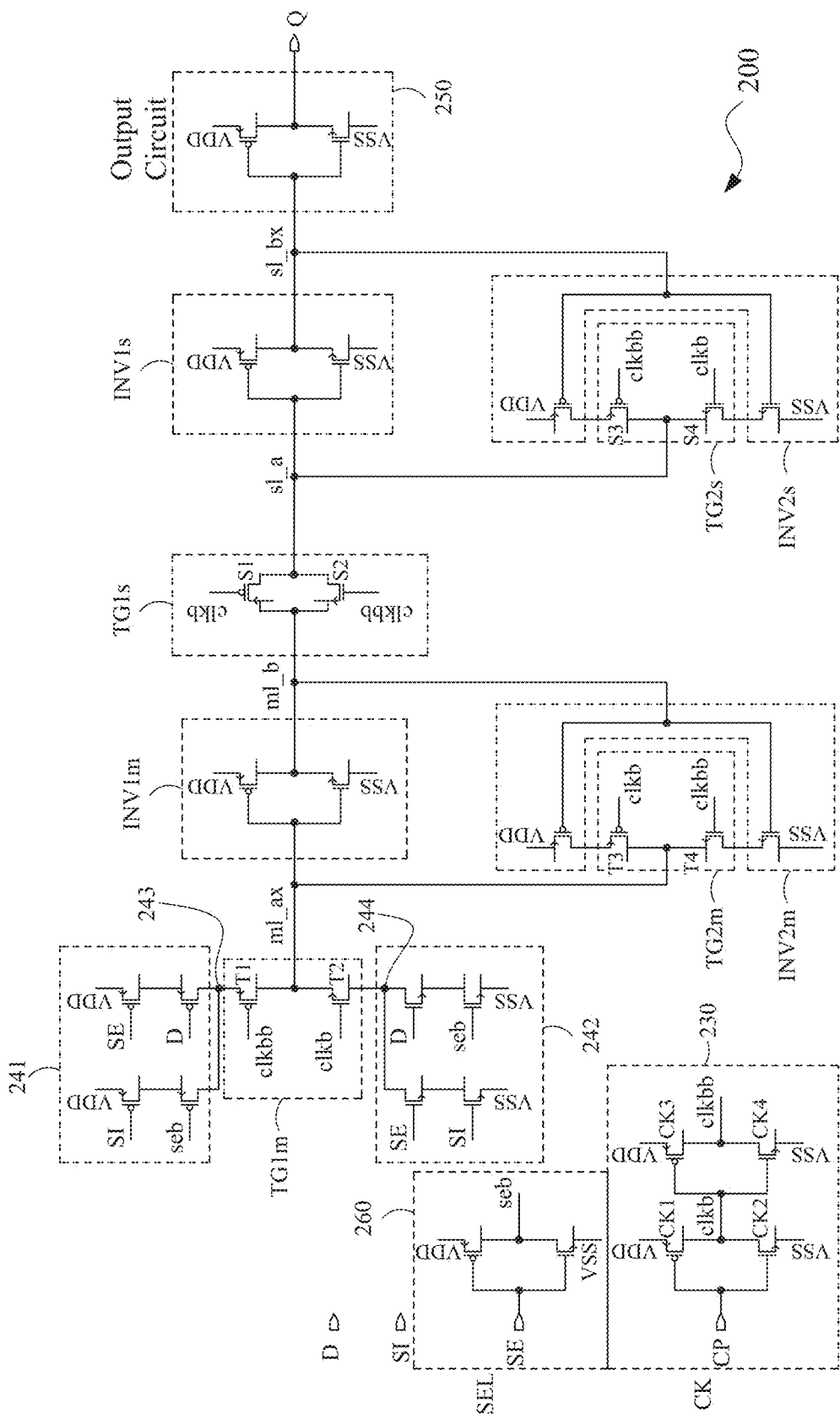
FIG. 2B is a circuit diagram of a flip-flop circuit, in accordance with some embodiments.

FIG. 2B is a circuit diagram of the flip-flop circuit 200, in accordance with some embodiments. The circuit diagram in FIG. 2B is an example of circuit realization of the logic diagram of FIG. 2A. Other circuitry configurations are within the scopes of various embodiments. Corresponding components in FIGS. 2A, 2B are designated by the same reference numerals. For simplicity, unless otherwise specified, a signal and a node at/to which the signal is generated/supplied are designated by the same reference numeral. For example, the signal at node ml_b is referred to as signal ml_b.

In FIG. 2B, the flip-flop circuit 200 comprises inputs D, SI and SE, a clock input CP, and the output Q. The inputs D, SI and SE correspond to the data input D, scan-in input Si and scan-enable input So of the multiplexer MUX. The clock input CP corresponds to the clock input 233.

A master latch circuit (not numbered in FIG. 2B) corresponding to the master latch circuit 210 comprises the transmission gates TG1m, TG2m and inverters INV1m, INV2m. The transmission gate TG1m comprises a pair of transistors T1, T2 having gates correspondingly coupled to receive the second clock signal clkbb and the first clock signal clkb. The transistors T1, T2 are of opposite types. For example, the transistor T1 is a p-type transistor, and the transistor T2 is an n-type transistor. In some embodiments, the transistor T1 is a p-channel metal-oxide semiconductor (PMOS) transistor, and the transistor T2 is a n-channel metal-oxide semiconductor (NMOS) transistor. Other transistor configurations are within the scopes of various embodiments. A source/drain of the transistor T1 is coupled to a source/drain of the transistor T2 at a node ml_ax corresponding to the intermediate node 212. Another source/drain of the transistor T1 and another source/drain of the transistor T2 are correspondingly coupled to circuits 241, 242, correspondingly at nodes 243, 244. The circuits 241, 242 constitute a multiplexer corresponding to the multiplexer MUX, as described herein.

The transmission gate TG2m comprises a pair of transistors T3, T4 having gates correspondingly coupled to receive the first clock signal clkb and the second clock signal clkbb. In some embodiments, the transistor T3 is a PMOS transistor, and the transistor T4 is an NMOS transistor. A source/drain of the transistor T3 is coupled to a source/drain of the transistor T4 at the node ml_ax. Another source/drain of the transistor T3 and another source/drain of the transistor T4 are coupled to an output of the inverter INV2m.

The inverter INV1m comprises a PMOS transistor (not numbered) and an NMOS transistor (not numbered) serially coupled between a power supply voltage VDD and a ground voltage VSS. The gates of the PMOS and NMOS transistors are coupled to the node ml_ax. A source/drain of the PMOS transistor is coupled to a source/drain of the NMOS transistor at a node ml_b corresponding to the data output 213 of the master latch circuit.

The inverter INV2m comprises a PMOS transistor (not numbered) and an NMOS transistor (not numbered) serially coupled between the power supply voltage VDD and the ground voltage VSS. The gates of the PMOS and NMOS transistors are coupled to the node ml_b. A source/drain of the PMOS transistor and a source/drain of the NMOS transistor configure the output of the inverter INV2m and are coupled to the transmission gate TG2m.

A slave latch circuit (not numbered in FIG. 2B) corresponding to the slave latch circuit 220 comprises the transmission gates TG1s, TG2s and inverters INV1s, INV2s. The transmission gate TG1s comprises a pair of transistors S1, S2 having gates correspondingly coupled to receive the first clock signal clkb and the second clock signal clkbb. In some embodiments, the transistor S1 is a PMOS transistor, and the transistor S2 is an NMOS transistor. A source/drain of the transistor S1 is coupled to a source/drain of the transistor S2 at the node ml_b. Another source/drain of the transistor S1 and another source/drain of the transistor S2 are coupled to a node sl_a corresponding to the intermediate node 222.

The transmission gate TG2s comprises a pair of transistors S3, S4 having gates correspondingly coupled to receive the second clock signal clkbb and the first clock signal clkb. In some embodiments, the transistor S3 is a PMOS transistor, and the transistor S4 is an NMOS transistor. A source/drain of the transistor S3 is coupled to a source/drain of the transistor S4 at the node sl_a. Another source/drain of the transistor S3 and another source/drain of the transistor S4 are coupled to an output of the inverter INV2s.

The inverter INV1s comprises a PMOS transistor (not numbered) and an NMOS transistor (not numbered) serially coupled between the power supply voltage VDD and the ground voltage VSS. The gates of the PMOS and NMOS transistors are coupled to the node sl_a. A source/drain of the PMOS transistor is coupled to a source/drain of the NMOS transistor at a node sl_bx corresponding to the data output 223 of the slave latch circuit.

The inverter INV2s comprises a PMOS transistor (not numbered) and an NMOS transistor (not numbered) serially coupled between the power supply voltage VDD and the ground voltage VSS. The gates of the PMOS and NMOS transistors are coupled to the node sl_bx. A source/drain of the PMOS transistor and a source/drain of the NMOS transistor configure the output of the inverter INV2s and are coupled to the transmission gate TG2s.

The clock circuit 230 comprises a first inverter corresponding to the inverter INVA, and a second inverter corresponding to the inverter INVB. The first inverter comprises a PMOS transistor CK1 and an NMOS transistor CK2 serially coupled between the power supply voltage VDD and the ground voltage VSS. Gates of the transistors CK1, CK2 are coupled to the clock input CP to receive an input clock signal corresponding to the input clock signal Clock. A source/drain of the transistor CK1 and a source/drain of the transistor CK2 are coupled together to define an output of the first inverter where the first clock signal clkb is generated to be supplied to the master latch circuit and the slave latch circuit. The second inverter comprises a PMOS transistor CK3 and an NMOS transistor CK4 serially coupled between the power supply voltage VDD and the ground voltage VSS. Gates of the transistors CK3, CK4 are coupled to the output of the first inverter to receive the first clock signal clkb. A source/drain of the transistor CK3 and a source/drain of the transistor CK4 are coupled together to define an output of the second inverter where the second clock signal clkbb is generated to be supplied to the master latch circuit and the slave latch circuit.

The output circuit 250 comprises an inverter configured by a PMOS transistor and an NMOS transistor similarly to one or more inverters described in detail herein. An input of the output circuit 250 is coupled to the node sl_bx. The output circuit 250 is configured to invert a signal sl_bx at the node sl_bx to output an output signal Q at the output Q.

A selection circuit 260 (designated in the figures with label "SEL") comprises an inverter configured by a PMOS transistor and an NMOS transistor similarly to one or more inverters described in detail herein. An input of the selection circuit 260 is coupled to the input SE. The selection circuit 260 is configured to invert a selection signal SE at the input SE to output a signal seb. In at least one embodiment, the selection circuit 260 is omitted.

A multiplexer corresponding to the multiplexer MUX comprises the circuits 241, 242. The circuit 241 comprises four PMOS transistors (not numbered) having gates correspondingly coupled to receive signals SI, seb, SE, D. The PMOS transistors having the gates correspondingly coupled to receive signals SI, seb are serially coupled between the power supply voltage VDD and the node 243. The PMOS transistors having the gates correspondingly coupled to receive signals SE, D are serially coupled between the power supply voltage VDD and the node 243. The circuit 242 comprises four NMOS transistors (not numbered) having gates correspondingly coupled to receive signals SE, SI, D, seb. The NMOS transistors having the gates correspondingly coupled to receive signals SE, SI are serially coupled between the ground voltage VSS and the node 244. The NMOS transistors having the gates correspondingly coupled to receive signals D, seb are serially coupled between the ground voltage VSS and the node 244. In the example configuration in FIG. 2B, when the signal SE is at a logic high level, the signal SI is passed by the multiplexer to the transmission gate TG1*m*, and when the signal SE is at a logic low level, the signal D is passed by the multiplexer to the transmission gate TG1*m*.

A flop speed Sp of the flip-flop circuit 200 is calculated by the following Expression (1)

$$Sp = 1/(T_{setup} + T_{cp2q}) \qquad (1)$$

In Expression (1), $T_{setup}$, or setup time, is the data arrival time before a clock transition, and is calculated by the following Expression (2), and $T_{cp2q}$, or output delay time, is calculated by the following Expression (3)

$$T_{setup} = T_{D2ml\_b} - T_{ck2mTXG} \qquad (2)$$

$$T_{cp2q} = T_{ck2sITXG} - T_{ml\_b2Q} \qquad (3)$$

In Expression (2), $T_{D2\ ml\_b}$, or time delay from D to ml_b, is a time delay associated with the transmission gate TG1*m*, and indicates how much time the transmission gate TG1*m*, when turned ON, takes to pass input data at the data input D to the node ml_b. $T_{D2ml\_b}$ is related to a configuration and/or a manufacturing process of the transmission gate TG1*m*, and is assumed to be constant. $T_{D2ml\_b}$ is further described with respect to FIG. 2C.

Also in Expression (2), $T_{ck2mTXG}$, or time delay from clock to master transmission gate, is a time delay associated with a clock propagation path from the clock circuit 230 to the master latch circuit, and indicates how much time it takes for a clock transition occurring in the clock signal at the output of the clock circuit 230 to arrive at the transmission gate TG1*m* to turn ON the transmission gate TG1*m*. In some embodiments, $T_{ck2mTXG}$ is configurable by a place-and-route operation, as described herein. $T_{ck2mTXG}$ is further described with respect to FIG. 2C.

In Expression (3), $T_{ck2sITXG}$, or time delay from clock to slave transmission gate, is a time delay associated with a clock propagation path from the clock circuit 230 to the slave latch circuit, and indicates how much time it takes for a clock transition occurring in the clock signal at the output of the clock circuit 230 to arrive at the transmission gate TG1*s* to turn ON the transmission gate TG1*s*.

Also in Expression (3), $T_{ml\_b2Q}$, or time delay from node ml_b to output Q, is a time delay associated with the transmission gate TG1*s*, and indicates how much time the transmission gate TG1*s*, when turned ON, takes to pass data at the node ml_b to the output Q. $T_{ml\_b2Q}$ is related to a configuration and/or a manufacturing process of the transmission gate TG1*s*, and is assumed to be constant.

From Expressions (1)-(3), the flop speed Sp of the flip-flop circuit 200 is calculated by the following Expression (4)

$$Sp = 1/T_{D2ml\_b} + T_{ml\_b2Q} + T_{ck2sITXG} - T_{ck2mTXG}) \qquad (4)$$

Given that $T_{D2ml\_b}$ and $T_{ml\_b2Q}$ are assumed to be constant, to boost the performance or to increase the flop speed Sp of the flip-flop circuit 200, $T_{ck2sITXG}$ is to be decreased and/or $T_{ck2mTXG}$ is to be increased. In some embodiments, in view of various design consideration, it is desirable to minimize resistance and capacitance of the clock nets for propagating clock signals. That is, the shortest metal routing (clock nets) with low surrounding influence, i.e., with the smallest possible time delays, is attempted to be routed from the clock circuit to the latch circuits. Therefore, it is difficult to further decrease $T_{ck2sITXG}$ to boost the performance.

However, it is possible, in one or more embodiments, to increase $T_{ck2mTXG}$ to boost the performance, i.e., to increase the flop speed Sp of the flip-flop circuit 200. At a greater time delay $T_{ck2mTXG}$, the setup time $T_{setup}$ is decreased, and the flop speed Sp of the flip-flop circuit 200 is increased. In some embodiments, $T_{ck2mTXG}$ (i.e., the time delay from the clock circuit to the master latch circuit) is increased to be greater than $T_{ck2sITXG}$ (i.e., the time delay from the clock circuit to the slave latch circuit) by a place-and-route operation. As a result, the slave latch circuit responds to clock switching (or clock transition) faster than the master latch circuit, with improved performance, in one or more embodiments. In some embodiments, $T_{ck2sITXG}$ corresponds to the smallest possible time delay from the clock circuit to the slave latch circuit, as permitted by various design rules for IC devices. In at least one embodiment, an FEOL layout is generated, e.g., in a placement operation, to physically place the clock circuit to be closer to the slave latch circuit than to the master latch circuit, for example, as described with respect to FIGS. 3A-3D, 5A, 7A-7B. In at least one embodiment, a BEOL routing path is generated, e.g., in a routing operation, to couple the clock circuit to the master latch circuit by a physically longer electrical path (or electrical connection) than from the clock circuit to the slave latch circuit, for example, as described with respect to FIGS. 3A-3H, 5A-5B, 7A-7C.

Figure 2C:
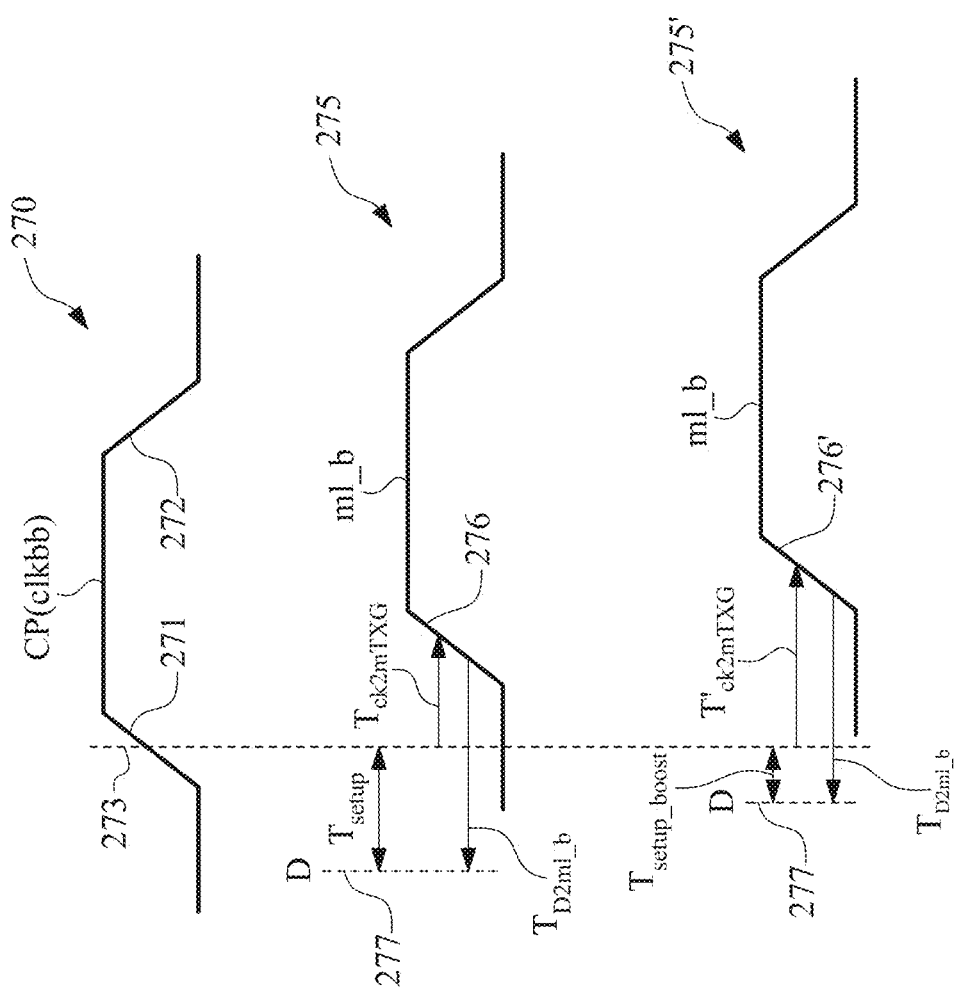
FIG. 2C is a schematic timing diagram of operations of a flip-flop circuit, in accordance with some embodiments.

FIG. 2C is a schematic timing diagram of operations of the flip-flop circuit 200, in accordance with some embodiments.

At the top section of the timing diagram in FIG. 2C, a clock pulse 270 of the input clock signal CP, also corresponding to the second clock signal clkbb, is schematically illustrated. The clock pulse 270 has a rising edge 271 corresponding to a clock transition from a logic low level, e.g., 0, to a logic high level, e.g., 1. The clock pulse 270 further has a falling edge 272 corresponding to a clock transition from 1 to 0. A line 273 indicates a timing when a signal level at the rising edge 271 is sufficient to turn ON the transmission gate TG1*m* of the master latch circuit. As described with respect to FIG. 2B, responsive to the rising edge 271 of the clock pulse 270, the master latch circuit latches input data D, and responsive to the falling edge 272 of the clock pulse 270, the master latch circuit outputs the latched input data as intermediate data to the slave latch circuit. Further, responsive to the rising edge 271 of the clock pulse 270, the slave latch circuit outputs previously latched intermediate data as output data at the output Q, and responsive to the falling edge 272 of the clock pulse 270, the slave latch circuit latches the intermediate data received from the master latch circuit.

At the middle section of the timing diagram in FIG. 2C, a pulse 275 of signal ml_b is schematically illustrated. The pulse 275 of signal ml_b has a rising edge 276 corresponding to the rising edge 271 of the clock pulse 270, and a rising edge (schematically illustrated at 277) of data D at a data input of the master latch circuit. Specifically, when the signal level at the rising edge 271 of the clock pulse 270 is sufficient to turn ON the transmission gate TG1*m* of the master latch circuit, data D at the data input (e.g., 211) is passed by the transmission gate TG1*m* to the node ml_b. The rising edge 277 of data D becomes the rising edge 276 when data D passed by the transmission gate TG1*m* arrives at the node ml_b. The time delay between the rising edges 277, 276 is $T_{D2ml\_b}$. The time delay between the rising edges 271, 276 is $T_{ck2mTXG}$. The time delay between the rising edges 277, 271 is the setup time, $T_{setup}$.

At the bottom section of the timing diagram in FIG. 2C, a pulse 275' of signal ml_b is schematically illustrated for a situation when $T_{ck2mTXG}$ is increased, e.g., to $T'_{ck2mTXG}$, in accordance with some embodiments. At the increased $T'_{ck2mTXG}$ and the same (or constant) $T_{D2ml\_b}$, the setup time is shortened, i.e., $T_{setup\_boost}$. A rising edge 276' of the pulse 275' arrives at the node ml_b later than as discussed with respect to the middle section of the timing diagram in FIG. 2C; however, the setup time is shortened and the performance of the flip-flop circuit is increased, in at least one embodiment. In some embodiments, the middle section and bottom section of the timing diagram in FIG. 2C also reflect a relationship in time between the arrival of the clock pulse 270 at the slave latch circuit (middle section) and the later arrival of the clock pulse 270 at the master latch circuit (bottom section).

Figure 2D:
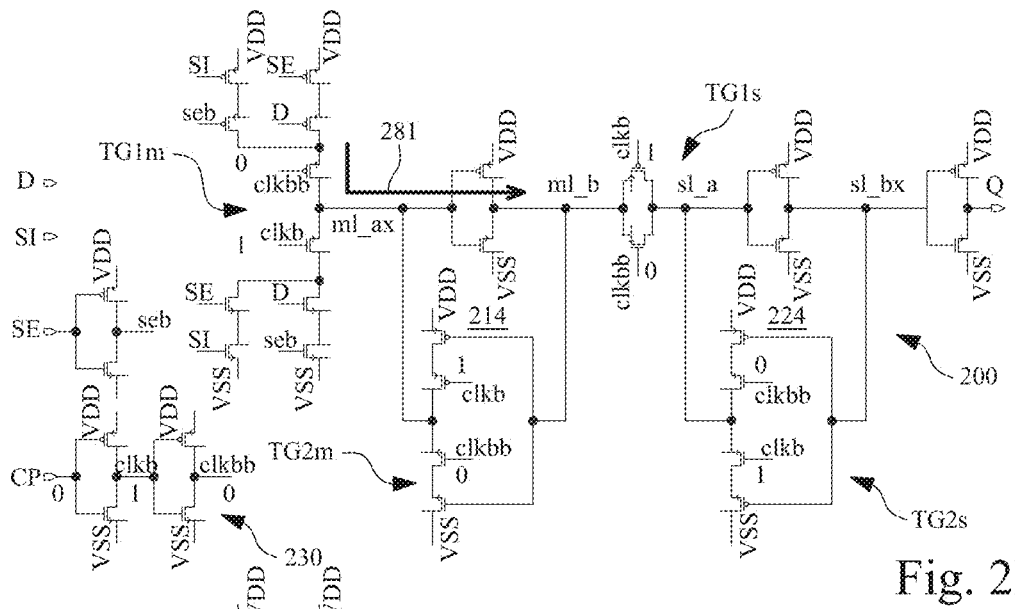
FIGS. 2D-2F are circuit diagrams schematically showing operations of a flip-flop circuit, in accordance with some embodiments.
Figure 2E:
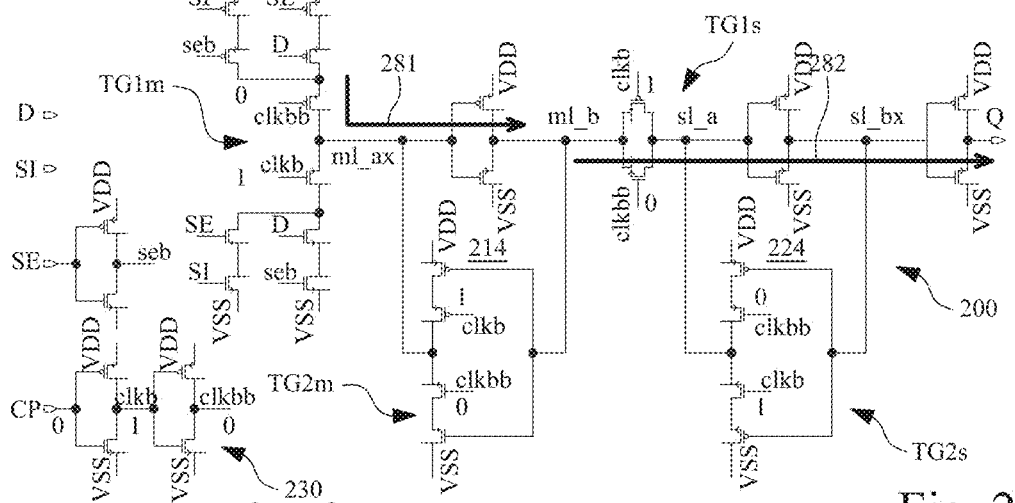
Figure 2F:
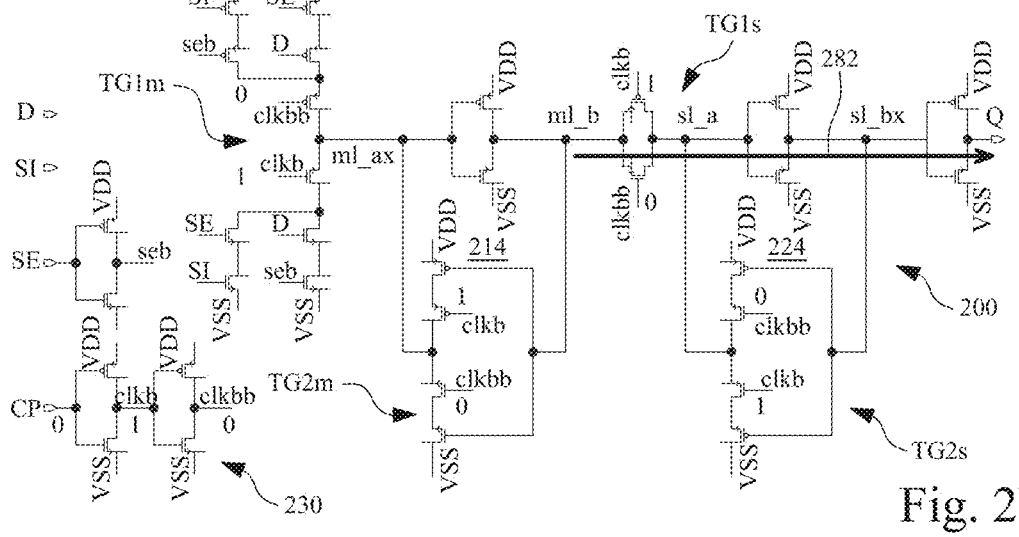

FIGS. 2D-2F are circuit diagrams schematically showing operations of the flip-flop circuit 200, in accordance with some embodiments.

In a read operation at FIG. 2D, the input clock signal CP and second clock signal clkbb are at 0, the first clock signal clkb is at 1, the transmission gates TG1*m*, TG2*s* are turned ON, and the transmission gates TG2*m*, TG1*s* are turned OFF. Data D are passed by the turned ON transmission gate TG1*m* to the signal ml_b, as schematically illustrated by arrow 281. The passed data are latched in the data retention circuit 214. Previously latched data stored in the data retention circuit 224 of the slave latch circuit are passed to the output Q.

In an intermediate stage at FIG. 2E, a clock transition occurs at the clock circuit 230, and the input clock signal CP and second clock signal clkbb become 1, and the first clock signal clkb become 0. This clock transition corresponds to the falling edge 272 of the clock pulse 270 in FIG. 2C. The time delay (e.g., $T_{ck2sITXG}$) of the electrical connection from the clock circuit 230 to the slave latch circuit is shorter than the time delay (e.g., $T_{ck2mTXG}$) of the electrical connection from the clock circuit 230 to the master latch circuit, and the clock transition occurring at the clock circuit 230 (i.e., the falling edge 272) arrives at the slave latch circuit before the master latch circuit. As a result, the transmission gate TG1*s* of the slave latch circuit is turned ON while the transmission gate TG1*m* is still turned ON. The transmission gate TG2*s* of the slave latch circuit is turned OFF. The turned ON transmission gate TG1*s* passes previously latched data stored in the data retention circuit 214 of the master latch circuit to the slave latch circuit, as schematically illustrated by arrow 281. Because the transmission gate TG1*m* is still turned ON during the intermediate stage, there is still sufficient time, in one or more embodiments, for the data D to be successfully passed to the node ml_b, despite the shortened setup time. The intermediate stage corresponds to an interval between arrival of the falling edge 272 of the clock pulse 270 at the slave latch circuit and later arrival of the falling edge 272 of the clock pulse 270 at the master latch circuit.

After the intermediate stage and in an output operation at FIG. 2F, the clock transition occurring at the clock circuit 230 (i.e., the falling edge 272) arrives at the master latch circuit, turns OFF the transmission gate TG1*m*, and turns ON the transmission gate TG2*m*. The data D are latched by the data retention circuit 214 of the master latch circuit. The described operations are repeated in a next clock cycle (e.g., next clock pulse).

FIG. 3A-3H are simplified schematic views of layouts of various circuit regions 300A-300H of one or more IC devices, in accordance with some embodiments. In some embodiments, one or more of the circuit regions 300A-300H are included in the region 104 of the IC device 100. Corresponding components in FIGS. 2A-2F and 3A-3H are designated by the same reference numerals.

Figure 3A:
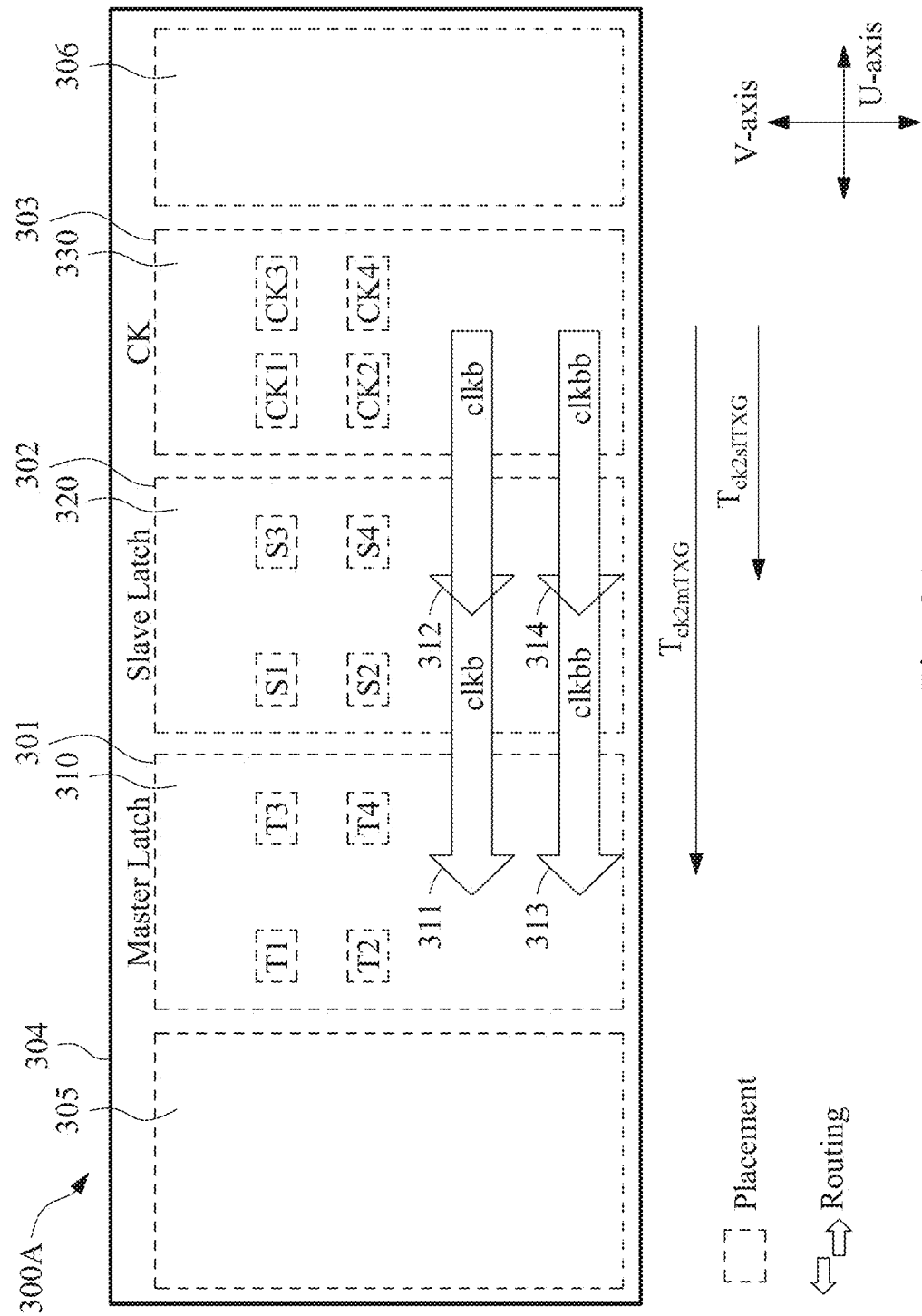
FIGS. 3A-3H are simplified schematic views of layouts of various circuit regions of one or more IC devices, in accordance with some embodiments.

In FIG. 3A, the circuit region 300A comprises a boundary 304 within which a master latch circuit 310, a slave latch circuit 320, a clock circuit 330, and further circuits 305, 306 are placed. In some embodiments, the master latch circuit 310, slave latch circuit 320, clock circuit 330 correspond to the master latch circuit 210, slave latch circuit 220, clock circuit 230. In some embodiments, each of the further circuits 305, 306 corresponds to one or more of the input circuit 240, output circuit 250, and selection circuit 260. In at least one embodiment, at least one of the further circuits 305, 306 includes circuitry other than those described with respect to one or more of FIGS. 2A-2F. In at least one embodiment, at least one of the further circuits 305, 306 is omitted.

In some embodiments, at least one of the master latch circuit 310, slave latch circuit 320, clock circuit 330, further circuits 305, 306 is a cell stored in or retrieved from one or more cell libraries. For example, the master latch circuit 310 is a cell that has a boundary 301 within which transistors T1-T4 are arranged and electrically coupled to form the transmission gates TG1*m*, TG2*m*. The master latch circuit 310 further comprises transistors forming the inverters INV1*m*, INV2*m* which are omitted in FIG. 3A for simplicity. In some embodiments, an example layout of the pair of transistors T1, T2 or the pair of transistors T3, T4 is similar to that described with respect to FIG. 8B. The slave latch circuit 320 is a cell that has a boundary 302 within which transistors S1-S4 are arranged and electrically coupled to form the transmission gates TG1*s*, TG2*s*. The slave latch circuit 320 further comprises transistors forming the inverters INV1*s*, INV2*s* which are omitted in FIG. 3A for simplicity. In some embodiments, an example layout of the pair of transistors S1, S2 or the pair of transistors S3, S4 is similar to that described with respect to FIG. 8B. The clock circuit 330 is a cell that has a boundary 303 within which transistors CK1-CK4 are arranged and electrically coupled to form the inverters INVA, INVB. In some embodiments, an example layout of the pair of transistors CK1, CK2 or the pair of transistors CK3, CK4 is similar to that described with respect to FIG. 8B. The described and/or illustrated arrangements of transistors in the master latch circuit 310, slave latch circuit 320, clock circuit 330 are examples. Other configurations are within the scopes of various embodiments.

The master latch circuit 310, slave latch circuit 320, clock circuit 330, further circuits 305, 306 are arranged along a U-axis. A V-axis is transverse to the U-axis. In some embodiments, the V-axis is perpendicular to the U-axis. In at least one embodiment, the U-axis corresponds to one of the X-axis and Y-axis, and the V-axis corresponds to the other of the X-axis and Y-axis. In at least one embodiment, at least one of the U-axis or V-axis corresponds to neither of the X-axis and Y-axis. Although the boundaries 301, 302, 303 and boundaries (not numbered) of the further circuits 305, 306 are illustrated in FIG. 3A as being spaced from each other along the U-axis, in at least one embodiment, boundaries of adjacent circuits are placed in abutment.

The circuit region 300A further comprises electrical connections 311, 312 electrically coupling the clock circuit 330 correspondingly with the master latch circuit 310, slave latch circuit 320, and configured to supply the first clock signal clkb to the master latch circuit 310, slave latch circuit 320. The circuit region 300A further comprises electrical connections 313, 314 electrically coupling the clock circuit 330 correspondingly with the master latch circuit 310, slave latch circuit 320, and configured to supply the second clock signal clkbb to the master latch circuit 310, slave latch circuit 320. In some embodiments, the electrical connections 311, 312, 313, 314 correspond to electrical connections 218, 219, 228, 229. For simplicity, the electrical connections 311-314 are schematically illustrated in FIG. 3A as arrows. Example electrical connections corresponding to one or more of the electrical connections 311-314 are described with respect to FIGS. 9A-9B. In at least one embodiment, one or more of the electrical connections 311-314 comprise one or more metal layers on a front side of a substrate of an IC device, and/or one or more backside metal layers on a back side of the substrate, as described with respect to FIGS. 8B-8C.

In the circuit region 300A, the clock circuit 330 is placed, e.g., in a placement operation, to be physically closer to the slave latch circuit 320 than to the master latch circuit 310. Specifically, the slave latch circuit 320 is placed to be between, along the U-axis, the master latch circuit 310 and the clock circuit 330. As a result, when the electrical connections 311-314 are routed in a routing operation, the physical lengths of the electrical connections 311, 313 for correspondingly supplying the first clock signal clkb and second clock signal clkbb from the clock circuit 330 to the master latch circuit 310 are greater than the physical lengths of the electrical connections 312, 314 for correspondingly supplying the first clock signal clkb and second clock signal clkbb from the clock circuit 330 to the slave latch circuit 320. The greater lengths of the electrical connections 311, 313 compared to the electrical connections 312, 314 configure the electrical connections 311, 313 to have a greater time delay ($T_{ck2mTXG}$) than a time delay ($T_{ck2sITXG}$) of the electrical connections 312, 314, with respect to both the first clock signal clkb and second clock signal clkbb. As a result, in at least one embodiment, improved performance, i.e., an increased flop speed, is achievable with respect to both the first clock signal clkb and second clock signal clkbb.

In at least one embodiment, the slave latch circuit 320 is placed to be as close as possible to the clock circuit 330. For example, the boundary 302 of the slave latch circuit 320 is place to abut the boundary 303 of the clock circuit 330. In at least one embodiment, the electrical connections 311-314 are routed to be the shortest paths (to have the smallest possible time delays) between the clock circuit 330 and the master latch circuit 310, slave latch circuit 320, as permitted by various design rules for IC devices. The time delay of the electrical connections 311, 313, although the shortest paths between the clock circuit 330 and the master latch circuit 310, are still greater than the time delay of the electrical connections 312, 314, because the master latch circuit 310 is placed farther away from the clock circuit 330 than the slave latch circuit 320.

Figure 3B:
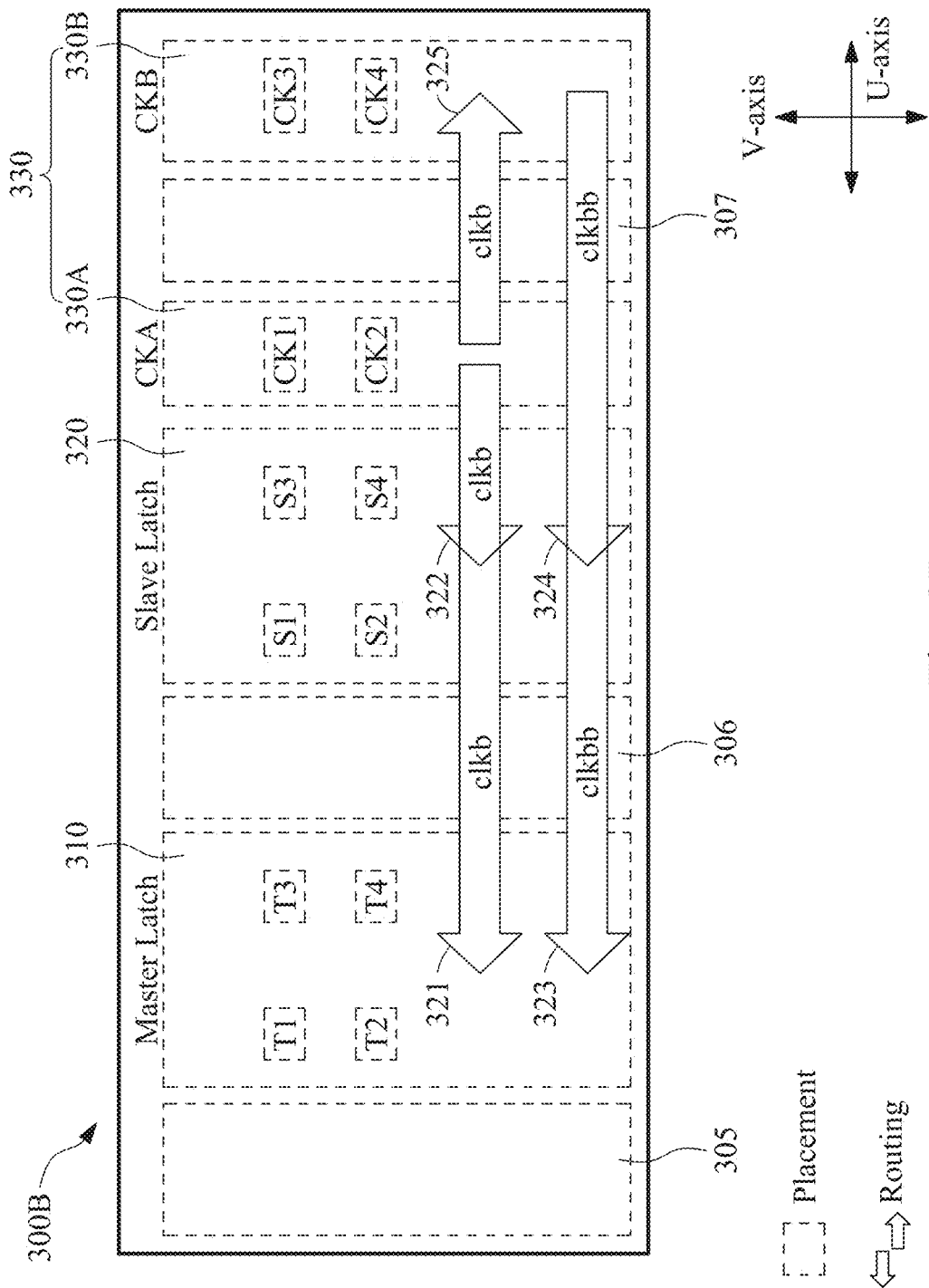

In FIG. 3B, the circuit region 300B is different from the circuit region 300A in that the clock circuit 330 is configured as two clock circuits 330A, 330B physically separated by a further circuit 307 and electrically coupled by an electrical connection 325. The clock circuit 330A comprises transistors CK1, CK2 and corresponds to the inverter INVA. The clock circuit 330B comprises transistors CK3, CK4 and corresponds to the inverter INVB. In some embodiments, the further circuit 307 comprises circuitry corresponding to at least one of the input circuit 240, output circuit 250, selection circuit 260, or other circuitry. In at least one embodiment, the further circuit 307 is omitted.

In a placement operation, the further circuit 305, master latch circuit 310, further circuit 306, slave latch circuit 320, clock circuit 330A, further circuit 307, clock circuit 330B are placed along the U-axis in the described order. Specifically, the slave latch circuit 320 is placed between the master latch circuit 310 and each of the clock circuit 330A, clock circuit 330B.

In a routing operation, electrical connections 321-324 corresponding to the electrical connections 311-314 are routed. Specifically, the electrical connections 321, 322 are routed to electrically couple the clock circuit 330A correspondingly with the master latch circuit 310, slave latch circuit 320 to supply the first clock signal clkb to the master latch circuit 310, slave latch circuit 320. The electrical connections 323, 324 are routed to electrically couple the clock circuit 330B correspondingly with the master latch circuit 310, slave latch circuit 320, to supply the second clock signal clkbb to the master latch circuit 310, slave latch circuit 320. The electrical connection 325 is also routed to electrically couple the clock circuit 330A to the clock circuit 330B, to supply the first clock signal clkb to the clock circuit 330B to enable to the clock circuit 330B to output the second clock signal clkbb. In at least one embodiment, the electrical connection 325 is routed to be the shortest path between the clock circuit 330A and the clock circuit 330B.

The physical lengths of the electrical connections 321, 323 for correspondingly supplying the first clock signal clkb and second clock signal clkbb from the clock circuit 330 to the master latch circuit 310 are greater than the physical lengths of the electrical connections 322, 324 for correspondingly supplying the first clock signal clkb and second clock signal clkbb from the clock circuit 330 to the slave latch circuit 320. The greater lengths of the electrical connections 321, 323 compared to the electrical connections 322, 324 configure the electrical connections 321, 323 to have a greater time delay than a time delay of the electrical connections 322, 324, with respect to both the first clock signal clkb and second clock signal clkbb. As a result, in at least one embodiment, improved performance, i.e., an increased flop speed, is achievable with respect to both the first clock signal clkb and second clock signal clkbb.

In at least one embodiment, boundaries of adjacent circuits in the circuit region 300B are placed in abutment. In at least one embodiment, the electrical connections 321-324 are routed to be the shortest paths (to have the smallest possible time delays) between the corresponding clock circuit 330A, 330B and the master latch circuit 310, slave latch circuit 320, as permitted by various design rules for IC devices.

Figure 3C:
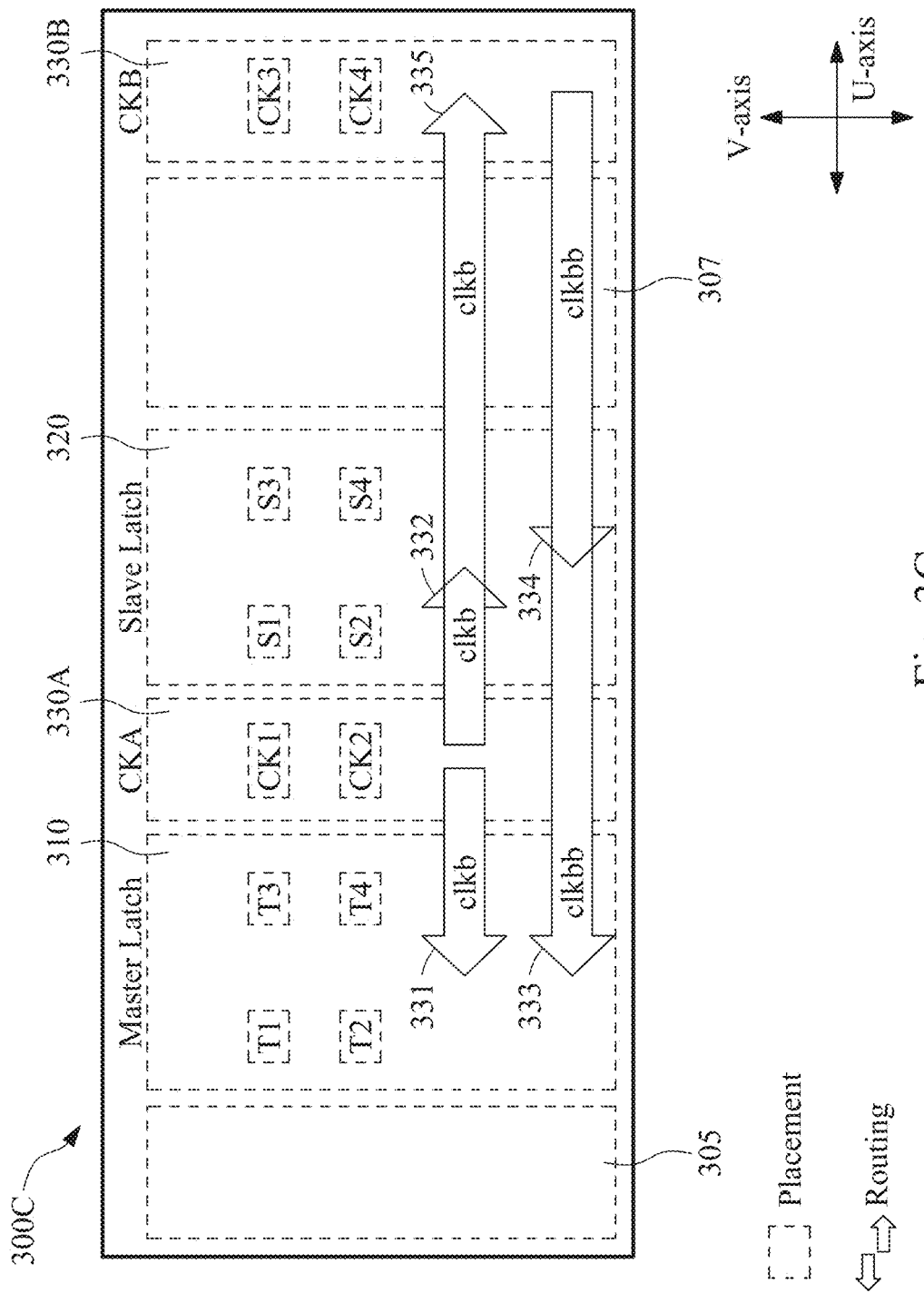

In FIG. 3C, the circuit region 300C is different from the circuit region 300B in that the clock circuit 330A is placed, in a placement operation, between the master latch circuit 310, slave latch circuit 320, and the further circuit 306 is omitted. In a routing operation, electrical connections 331-335 corresponding to the electrical connections 321-325 are routed. In some embodiments, the electrical connections 331-334 are routed to be the shortest paths (to have the smallest possible time delays) between the corresponding clock circuit 330A, 330B and the master latch circuit 310, slave latch circuit 320, as permitted by various design rules for IC devices. In at least one embodiment, the electrical connection 335 is routed to be the shortest path between the clock circuit 330A and the clock circuit 330B. In at least one embodiment, the electrical connections 331, 332 have the same physical length and the same time delay.

The physical length of the electrical connection 333 for supplying the second clock signal clkbb from the clock circuit 330B to the master latch circuit 310 is greater than the physical length of the electrical connection 334 for correspondingly supplying the second clock signal clkbb from the clock circuit 330B to the slave latch circuit 320, because the master latch circuit 310 is placed farther away from the clock circuit 330B than the slave latch circuit 320. As a result, in at least one embodiment, improved performance, i.e., an increased flop speed, is achievable at least with respect to the second clock signal clkbb. In at least one embodiment, the clock circuit 330A and clock circuit 330B physically switch place, and improved performance, i.e., an increased flop speed, is achievable at least with respect to the first clock signal clkb. In at least one embodiment, boundaries of adjacent circuits in the circuit region 300C are placed in abutment.

Figure 3D:
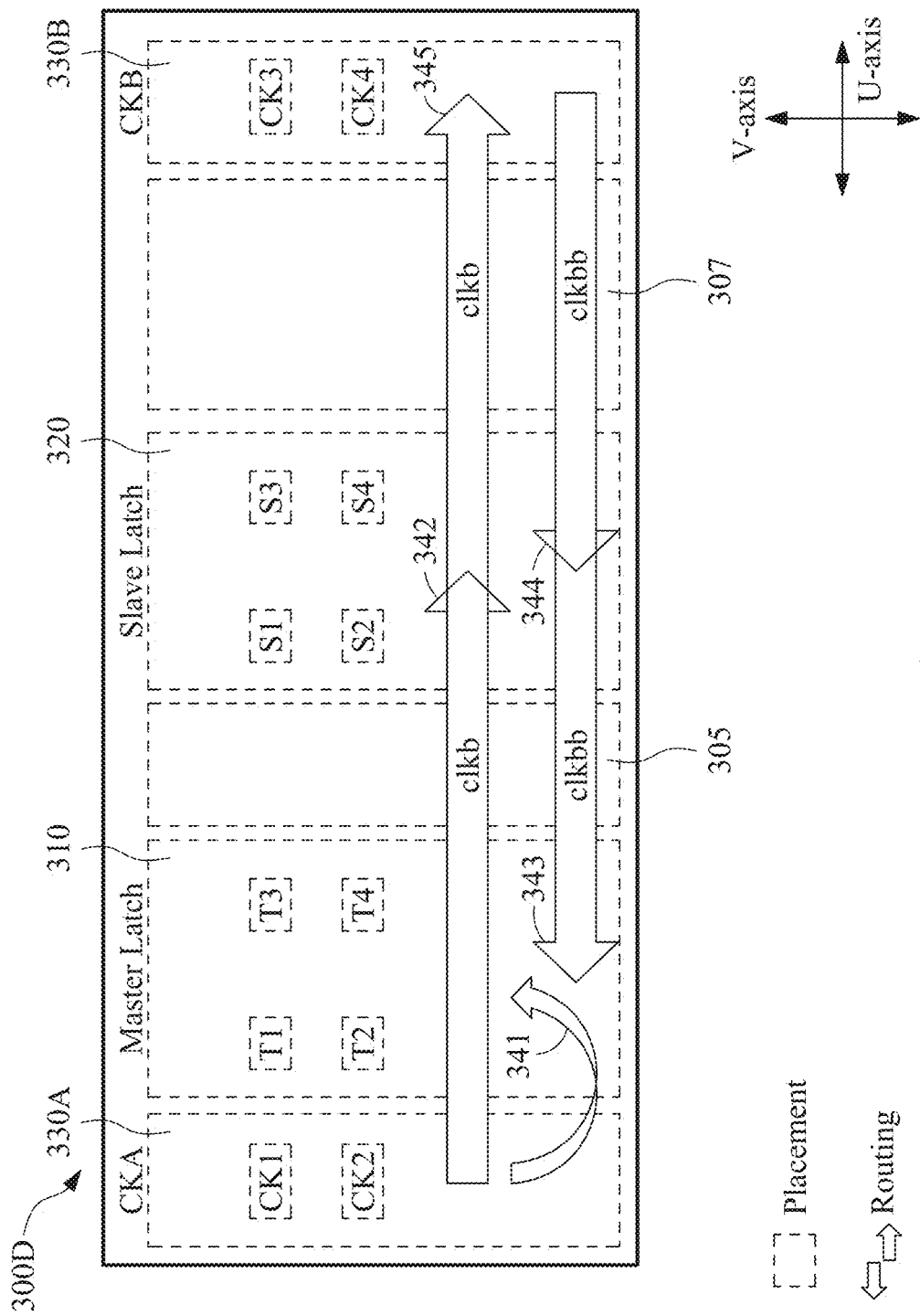

In FIG. 3D, the circuit region 300D is different from the circuit region 300C in that the clock circuit 330A and the further circuit 305 physically switch place. The master latch circuit 310 is placed, in a placement operation, between the clock circuit 330A and the slave latch circuit 320, and is physically closer to the clock circuit 330A than the slave latch circuit 320. In a routing operation, electrical connections 341-345 corresponding to the electrical connections 331-335 are routed. In some embodiments, the electrical connections 342-344 are routed to be the shortest paths (to have the smallest possible time delay) between the corresponding clock circuit 330A, 330B and the master latch circuit 310, slave latch circuit 320, as permitted by various design rules for IC devices. In at least one embodiment, the electrical connection 345 is routed to be the shortest path between the clock circuit 330A and the clock circuit 330B.

The electrical connection 341 comprises redundant routing. In at least one embodiment, the redundant routing comprises additional conductive patterns to make the electrical connection 341 physically longer, i.e., to have a greater time delay, than a shortest possible path between the clock circuit 330A and the master latch circuit 310. As a result, the electrical connection 341 has a physical length and time delay about the same as, or greater than, the physical length and time delay of the shortest path between the clock circuit 330A and the master latch circuit 310. An example electrical connection with redundant routing is described with respect to FIG. 9D. In some embodiments, an electrical connection between the master latch circuit 310 and the clock circuit 330A corresponds to the shortest path between the master latch circuit 310 and the clock circuit 330A. The physical length of the electrical connection 343 for supplying the second clock signal clkbb from the clock circuit 330B to the master latch circuit 310 is greater than the physical length of the electrical connection 344 for correspondingly supplying the second clock signal clkbb from the clock circuit 330B to the slave latch circuit 320. As a result, in at least one embodiment, improved performance, i.e., an increased flop speed, is achievable at least with respect to the second clock signal clkbb. In at least one embodiment, the clock circuit 330A and clock circuit 330B physically switch place, and improved performance, i.e., an increased flop speed, is achievable at least with respect to the first clock signal clkb. In at least one embodiment, boundaries of adjacent circuits in the circuit region 300D are placed in abutment.

FIGS. 3A-3D are examples showing that by placing the master latch circuit 310 to be physically farther away from the clock circuit 330, 330A, 330B than the slave latch circuit 320, it is possible, in one or more embodiments, to increase the time delay of the electrical connection between the master latch circuit 310 and the clock circuit 330, 330A, 330B to be greater than the time delay of the electrical connection between the slave latch circuit 320 and the clock circuit 330, 330A, 330B, simply by routing along the shortest possible paths between the corresponding master or slave latch circuit and the corresponding clock circuit. FIGS. 3E-3H are examples showing that even when the physical distance from the master latch circuit 310 to the clock circuit 330, 330A, 330B is about the same as the physical distance from the slave latch circuit 320 to the clock circuit 330, 330A, 330B, it is still possible, in one or more embodiments, to increase the time delay of the electrical connection between the master latch circuit 310 and the clock circuit 330, 330A, 330B to be greater than the time delay of the electrical connection between the slave latch circuit 320 and the clock circuit 330, 330A, 330B, by an appropriate routing operation.

Figure 3E:
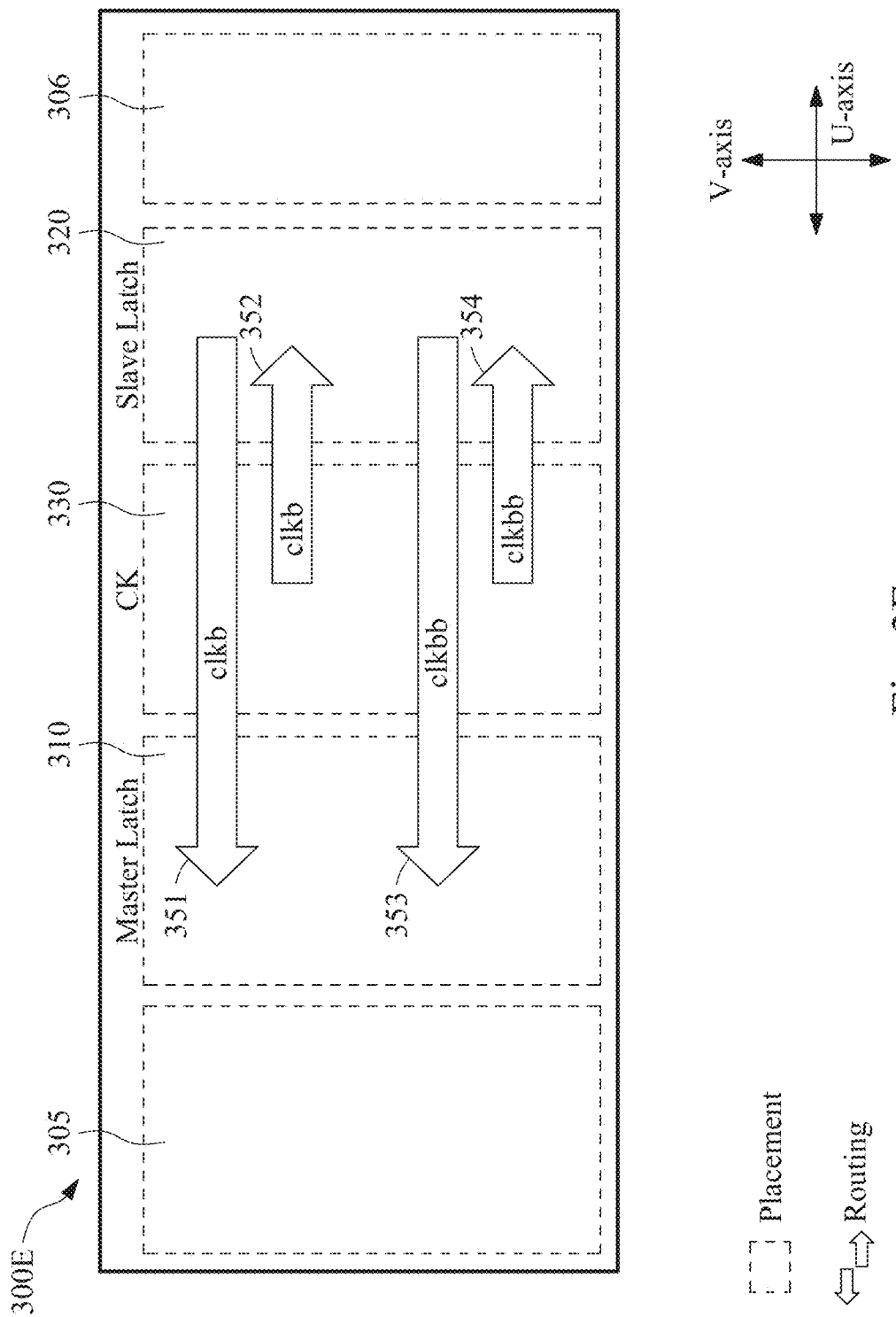

In FIG. 3E, the circuit region 300E is different from the circuit region 300A in that the clock circuit 330 and the slave latch circuit 320 physically switch place. The clock circuit 330 is placed, in a placement operation, between the master latch circuit 310 and the slave latch circuit 320.

In at least one embodiment, the shortest path from the clock circuit 330 to the master latch circuit 310 and the shortest path from the clock circuit 330 to the slave latch circuit 320 have about the same physical length and time delay. To increase the time delay between the clock circuit 330 and the master latch circuit 310 with respect to the first clock signal clkb, the electrical connection between the master latch circuit 310 and the clock circuit 330 comprises serially coupled electrical connection 352 and electrical connection 351. The electrical connection 352 is routed between the clock circuit 330 and the slave latch circuit 320. The electrical connection 351 is electrically coupled to the electrical connection 352, and is routed between the slave latch circuit 320 and the master latch circuit 310. As a result, the electrical connection between the clock circuit 330 and the master latch circuit 310 is physically longer than the shortest path between the clock circuit 330 and the master latch circuit 310, and is physically longer than the electrical connection 352 between the clock circuit 330 and the slave latch circuit 320. In at least one embodiment, the electrical connections 351, 352 are routed to be the shortest paths (to have the smallest possible time delays) from the slave latch circuit 320 correspondingly to the master latch circuit 310 and clock circuit 330, as permitted by various design rules for IC devices. Example electrical connections corresponding to the electrical connections 351, 352 are described with respect to FIG. 9C.

Similarly, with respect to the second clock signal clkbb, electrical connections 353, 354 corresponding to the electrical connections 351, 352 are routed from the slave latch circuit 320 correspondingly to the master latch circuit 310 and clock circuit 330. In at least one embodiment, the electrical connections 353, 354 are routed to be the shortest paths (to have the smallest possible time delays) from the slave latch circuit 320 correspondingly to the master latch circuit 310 and clock circuit 330, as permitted by various design rules for IC devices. In at least one embodiment, improved performance, i.e., an increased flop speed, is achievable with respect to both the first clock signal clkb and the second clock signal clkbb. In at least one embodiment, boundaries of adjacent circuits in the circuit region 300E are placed in abutment.

Figure 3F:
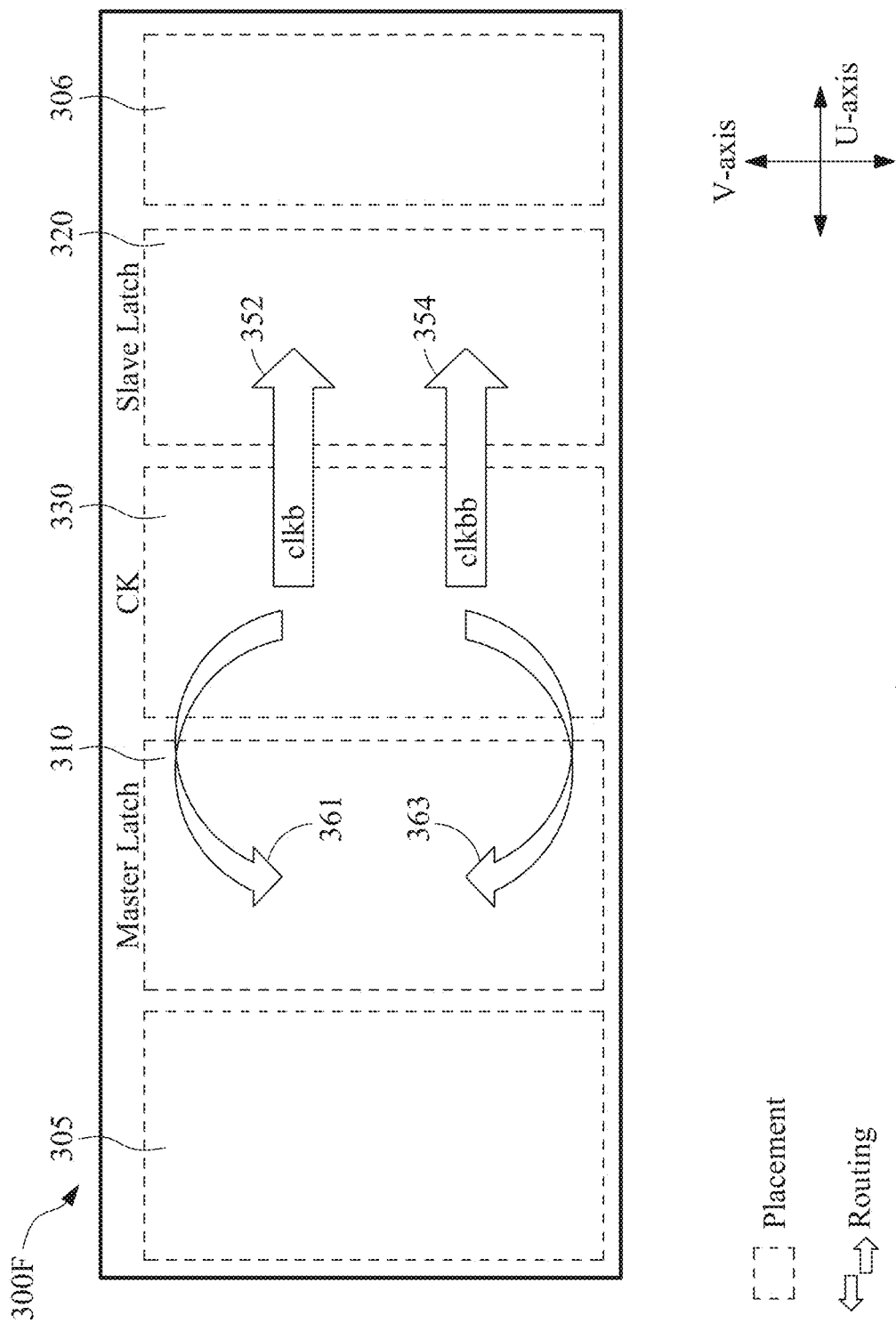

In FIG. 3F, the circuit region 300F is different from the circuit region 300E in that the electrical connections 351, 353 are correspondingly replaced by electrical connections 361, 362 which comprise redundant routing. Examples of redundant routing are described with respect to FIGS. 3D, 9D. The redundant routing increases the physical lengths and time delays of the electrical connections 361, 362 between the clock circuit 330 and the master latch circuit 310 to be greater than the physical lengths and time delays of the electrical connections 352, 354 between the clock circuit 330 and the slave latch circuit 320. In at least one embodiment, improved performance, i.e., an increased flop speed, is achievable with respect to both the first clock signal clkb and the second clock signal clkbb. In at least one embodiment, boundaries of adjacent circuits in the circuit region 300F are placed in abutment.

Figure 3G:
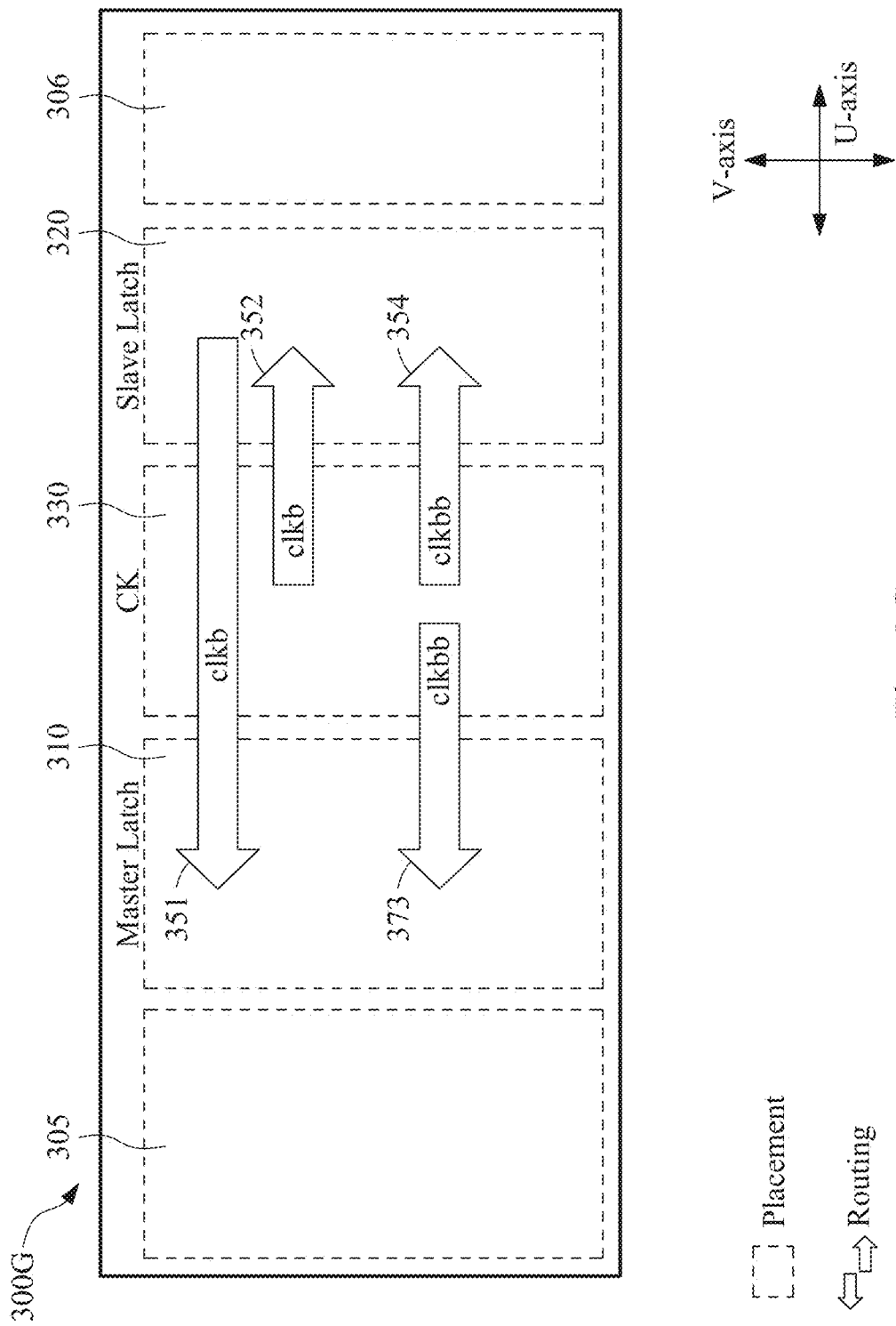

In FIG. 3G, the circuit region 300G is different from the circuit region 300E in that the electrical connection 353 is replaced by an electrical connection 373 routed between the clock circuit 330 and the master latch circuit 310. In some embodiments, the electrical connection 373 is routed to be the shortest path (to have the smallest possible time delay) from the master latch circuit 310 to the clock circuit 330. In at least one embodiment, the electrical connection 373 has a physical length and time delay about the same as the physical length and time delay of the electrical connection 354. In at least one embodiment, improved performance, i.e., an increased flop speed, is still achievable with respect to at least the first clock signal clkb. In some embodiments, the electrical connections for the first clock signal clkb and the electrical connections for the second clock signal clkbb in FIG. 3G switch place, to achieve improved performance, i.e., an increased flop speed, with respect to at least the second clock signal clkbb. In at least one embodiment, boundaries of adjacent circuits in the circuit region 300G are placed in abutment.

Figure 3H:
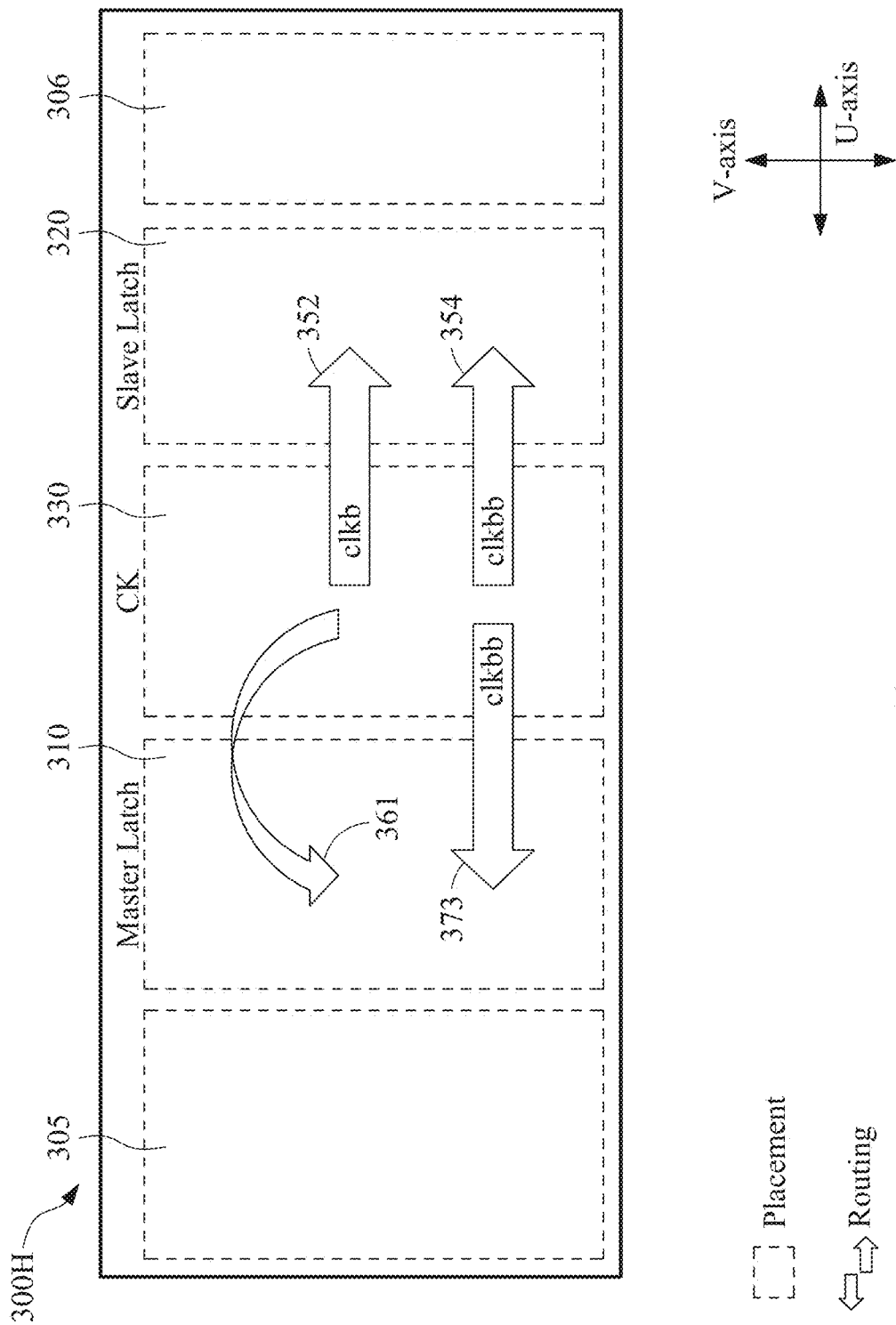

In FIG. 3H, the circuit region 300H is different from the circuit region 300F in that the electrical connection 363 with redundant routing is replaced by the electrical connection 373. In at least one embodiment, improved performance, i.e., an increased flop speed, is achievable with respect to at least the first clock signal clkb. In some embodiments, the electrical connections for the first clock signal clkb and the electrical connections for the second clock signal clkbb in FIG. 3H switch place, to achieve improved performance, i.e., an increased flop speed, with respect to at least the second clock signal clkbb. In at least one embodiment, boundaries of adjacent circuits in the circuit region 300H are placed in abutment.

Figure 4:
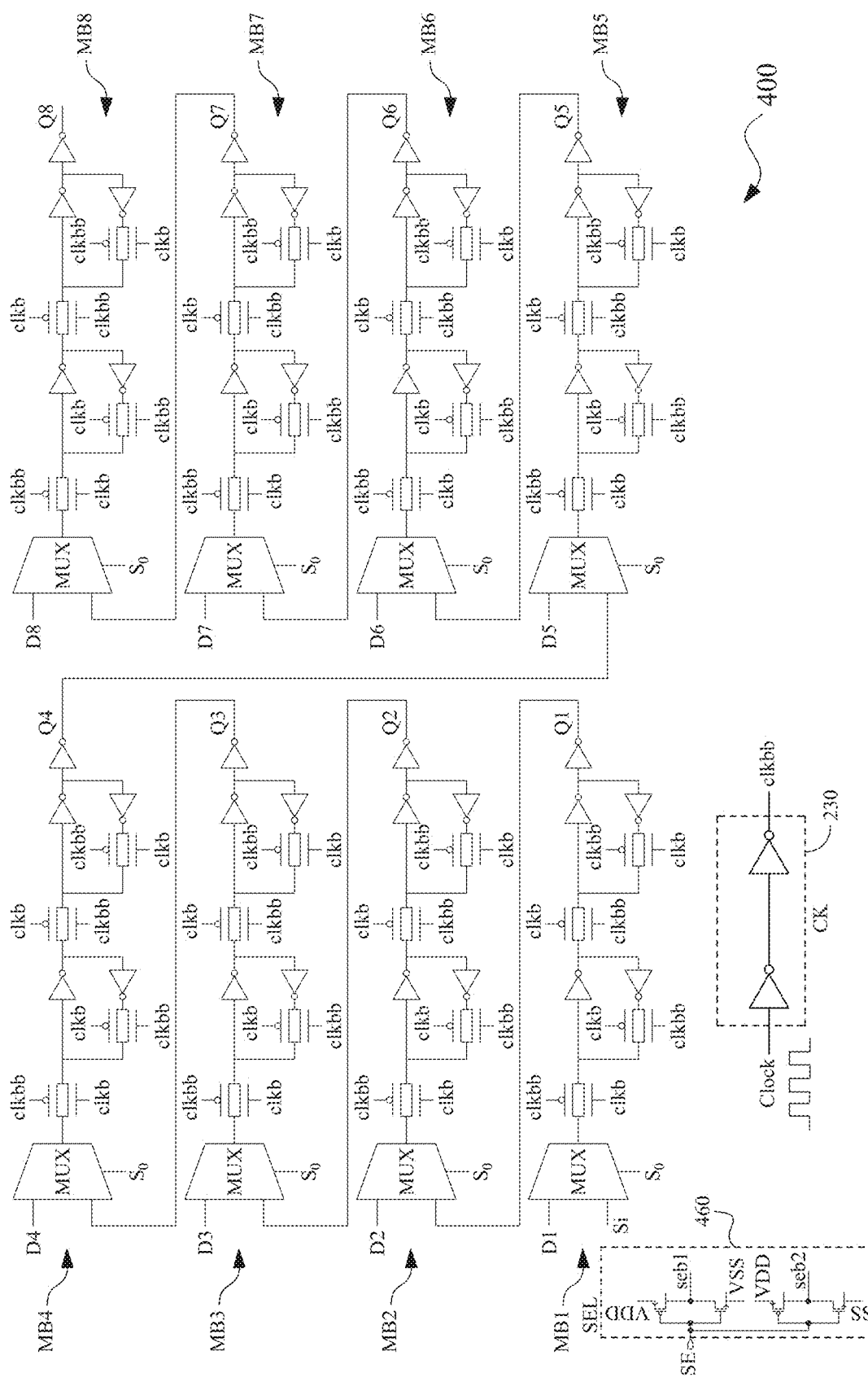
FIG. 4 is a schematic logic diagram of a multibit flip-flop circuit, in accordance with some embodiments.

FIG. 4 is a schematic logic diagram of a multibit flip-flop circuit 400, in accordance with some embodiments.

The multibit flip-flop circuit 400 comprises a plurality of flip-flop circuits MB1-MB8. Each of the flip-flop circuits MB1-MB8 comprises an input circuit, a master latch circuit, a slave latch circuit and an output circuit corresponding to the input circuit 240, master latch circuit 210, slave latch circuit 220 and output circuit 250. The flip-flop circuits MB1-MB8 are configured to correspondingly receive bits D1-D8 of input data D, and to correspondingly output bits Q1-Q8 of output data Q. The flip-flop circuits MB1-MB8 are serially coupled with each other, so that the output of one flip-flop circuit is electrically coupled to the input SI (or Si) of the subsequent flip-flop circuit. For example, the output Q1 of the flip-flop circuit MB1 is electrically coupled to the input SI (or Si) of the subsequent flip-flop circuit MB2.

The multibit flip-flop circuit 400 comprises a common clock circuit 230 and a common selection circuit 460 for all of the flip-flop circuits MB1-MB8. Compared to the selection circuit 260, the selection circuit 460 comprises an additional inverter, and the inverters of the selection circuit 460 are configured to correspondingly output signals seb1, seb2 both of which are inverted to the selection signal SE. One of the signals seb1, seb2 is supplied to the inputs SE (or So) of one half of the flip-flop circuits MB1-MB8, and the other of the signals seb1, seb2 is supplied to the inputs SE (or So) of the other half of the flip-flop circuits MB1-MB8. Other configurations are within the scopes of various embodiments.

Figure 5A:
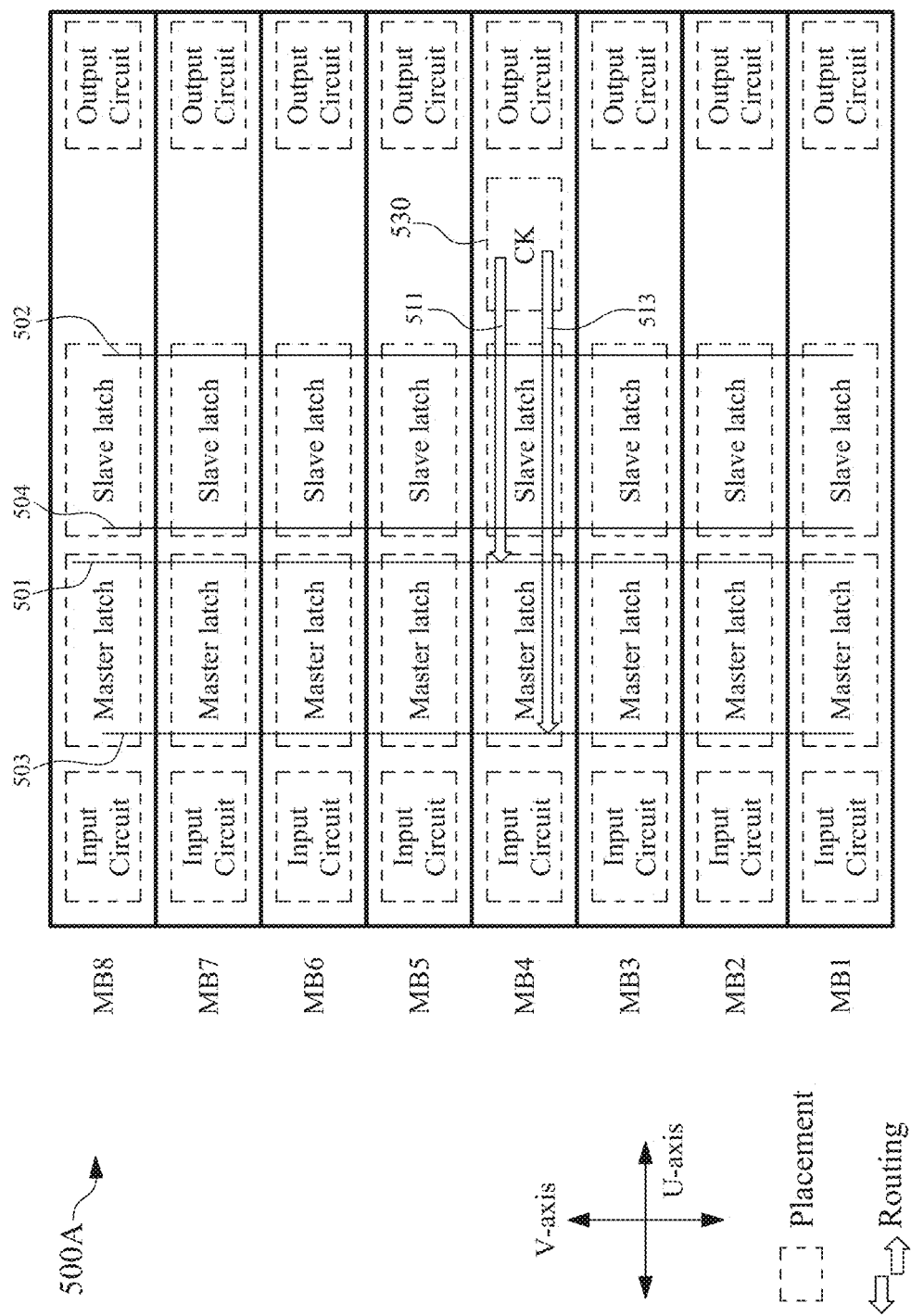
FIGS. 5A-5B are simplified schematic views of layouts of various circuit regions of one or more IC devices, in accordance with some embodiments.
Figure 5B:
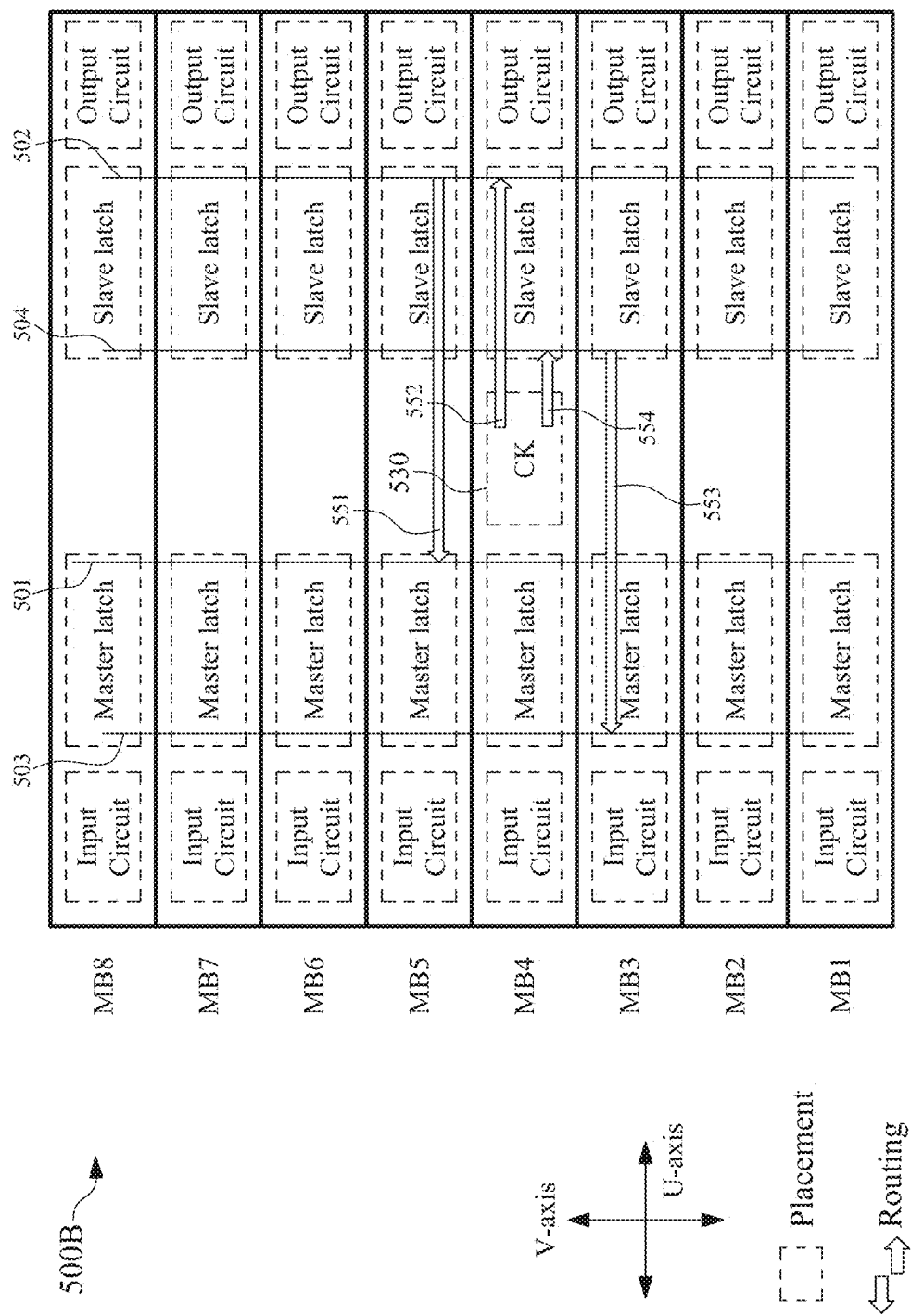

FIGS. 5A-5B are simplified schematic views of layouts of various circuit regions 500A-500B of one or more IC devices, in accordance with some embodiments. The circuit regions 500A, 500B comprise the multibit flip-flop circuit 400. In some embodiments, one or more of the circuit regions 500A-500B are included in the region 104 of the IC device 100. Corresponding components in FIGS. 2A-2F, 3A-3H, 4, 5A-5B are designated by the same reference numerals.

In the circuit region 500A in FIG. 5A, the flip-flop circuits MB1-MB8 are physically arranged along the V-axis, so that the master latch circuits of the flip-flop circuits MB1-MB8 are arranged in a column (not numbered) and the slave latch circuits of the flip-flop circuits MB1-MB8 are arranged in another column (not numbered) along the V-axis. The column of the slave latch circuits is arranged, along the U-axis, between a clock circuit 530 corresponding to the clock circuit 230, and the column of the master latch circuits of the flip-flop circuits MB1-MB8. Clock buses 501, 503 are arranged along the column on the master latch circuits, and are coupled to the master latch circuits to correspondingly supply the first clock signal clkb and the second clock signal clkbb to the master latch circuits. Clock buses 502, 504 are arranged along the column on the slave latch circuits, and are coupled to the slave latch circuits to correspondingly supply the first clock signal clkb and the second clock signal clkbb to the slave latch circuits.

Electrical connections 511, 513 corresponding to the electrical connections 311, 313 are routed from the clock circuit 530 correspondingly to the clock buses 501, 503 for correspondingly supplying the first clock signal clkb and second clock signal clkbb to the master latch circuits. Further electrical connections (not shown) corresponding to the electrical connections 312, 314 are routed from the clock circuit 530 correspondingly to the clock buses 502, 504 for correspondingly supplying the first clock signal clkb and second clock signal clkbb to the slave latch circuits. As described with respect to FIG. 3A, the electrical connections 511, 513 routed to the clock buses 501, 503 of the master latch circuits have greater physical lengths and greater time delays than the electrical connections routed to the clock buses 502, 504 of the slave latch circuits. As a result, in at least one embodiment, improved performance, i.e., an increased flop speed, is achievable with respect to both the first clock signal clkb and the second clock signal clkbb. In at least one embodiment, the electrical connections 511, 513, and the electrical connections (not shown) corresponding to the electrical connections 312, 314 are routed to be the shortest paths (to have the smallest possible time delays) from the clock circuit 530 to the clock buses 501, 503 of the master latch circuits and the clock buses 502, 504 of the slave latch circuits, as permitted by various design rules for IC devices.

In FIG. 5B, the circuit region 500B is different from the circuit region 500A in that the clock circuit 530 is arranged, along the U-axis, between the column of the slave latch circuits and the column of the master latch circuits of the flip-flop circuits MB1-MB8. Electrical connections 552, 554 corresponding to the electrical connections 352, 354 are routed from the clock circuit 530 correspondingly to the clock buses 502, 504 for correspondingly supplying the first clock signal clkb and second clock signal clkbb to the slave latch circuits.

Electrical connections 551, 553 corresponding to the electrical connections 351, 353 are serially coupled correspondingly to the electrical connections 552, 554 by the clock buses 502, 504. The electrical connections 551, 553 are correspondingly routed from the clock buses 502, 504 to the clock buses 501, 503 for correspondingly supplying the first clock signal clkb and second clock signal clkbb to the master latch circuits. As described with respect to FIG. 3E, the electrical connections from the clock circuit 530 to the master latch circuits include the serially coupled electrical connections 551, 552 for the first clock signal clkb and the serially coupled electrical connections 553, 554 for the second clock signal clkbb have greater physical lengths and greater time delays than the electrical connections 552, 554 routed from the clock circuit 530 to the slave latch circuits. As a result, in at least one embodiment, improved performance, i.e., an increased flop speed, is achievable with respect to both the first clock signal clkb and the second clock signal clkbb. In at least one embodiment, the electrical connections 551, 552 are routed to be the shortest paths (to have the smallest possible time delays) from the clock bus 502 correspondingly to the clock bus 501 and the clock circuit 530, as permitted by various design rules for IC devices. In at least one embodiment, the electrical connections 553, 554 are routed to be the shortest paths (to have the smallest possible time delays) from the clock bus 504 correspondingly to the clock bus 502 and the clock circuit 530, as permitted by various design rules for IC devices.

In some embodiments, one or more configurations described with respect to FIGS. 3B-3D and 3F-3H are applicable to multibit flip-flop circuits to increase the time delays of the clock signals supplied to the master latch circuits to be greater than the time delays of the clock signals supplied to the slave latch circuits, and to improve the performance of the multibit flip-flop circuits.

Figure 6:
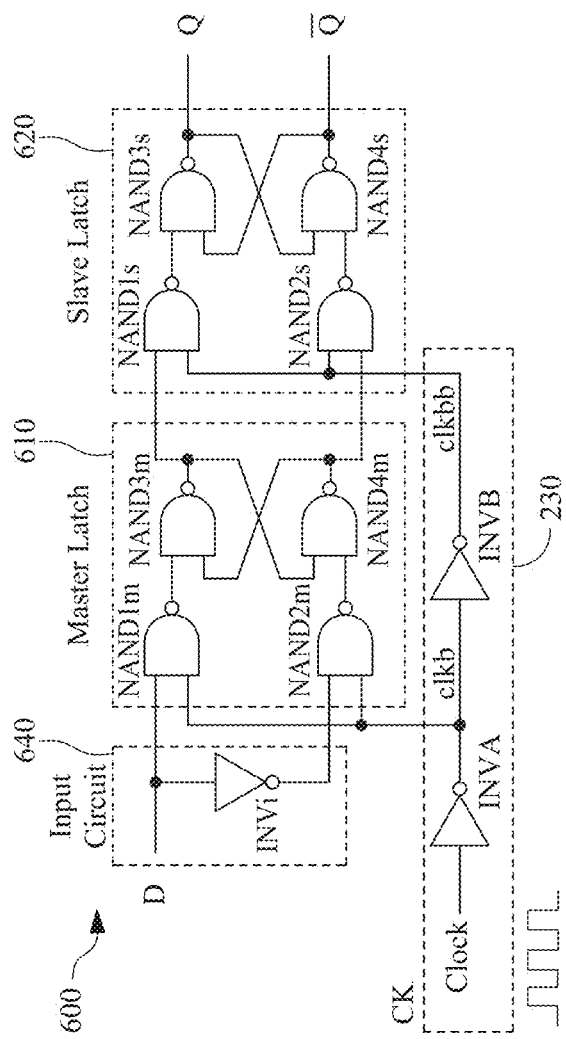
FIG. 6 is a schematic logic diagram of a flip-flop circuit, in accordance with some embodiments.

FIG. 6 is a schematic logic diagram of a flip-flop circuit 600, in accordance with some embodiments. The flip-flop circuit 600 comprises a master latch circuit 610, a slave latch circuit 620, a clock circuit 230, and an input circuit 640.

The input circuit 640 comprises an inverter INVi having an input coupled to the data input D, and an output. Other circuit configurations for the input circuit 640 are within the scopes of various embodiments. In at least one embodiment, the input circuit 640 is omitted.

The master latch circuit 610 comprises NAND gates NAND1m-NAND4m. A first input of the gate NAND1m is coupled to the data input D, and a first input of the gate NAND2m is coupled to the output of the inverter INVi. Second inputs of the gates NAND1m, NAND2m are configured as clock inputs, and are coupled to receive the first clock signal clkb output by the clock circuit 230. Outputs of the gates NAND1m, NAND2m are correspondingly coupled to first inputs of the gates NAND3m, NAND4m. Second inputs of the gate NAND3m, NAND4m are correspondingly coupled to outputs of the gate NAND4m, NAND3m, which are configured as outputs of the master latch circuit 610.

The slave latch circuit 620 comprises NAND gates NAND1s-NAND4s. First inputs of the gates NAND1s, NAND1s are correspondingly coupled to the outputs of the gates NAND3m, NAND4m. Second inputs of the gates NAND1s, NAND2s are configured as clock inputs, and are coupled to receive the second clock signal clkbb output by the clock circuit 230. Outputs of the gates NAND1s, NAND2s are correspondingly coupled to first inputs of the gates NAND3s, NAND4s. Second inputs of the gate NAND3s, NAND4s are correspondingly coupled to outputs of the gate NAND4s, NAND3s, which are configured as differential outputs Q and Q bar of the flip-flop circuit 600. In the example configuration in FIG. 6, the flip-flop circuit 600 is an SR flip-flop.

In some embodiments, a time delay of the first clock signal clkb from the clock circuit 230 to the master latch circuit 610 is greater than a time delay of the second clock signal clkbb from the clock circuit 230 to the slave latch circuit 620. As a result, in at least one embodiment, improved performance, i.e., an increased flop speed, is achievable, as described herein.

FIGS. 7A-7C are simplified schematic views of layouts of various circuit regions 700A-700C of one or more IC devices, in accordance with some embodiments. The circuit regions 700A-700C comprise flip-flop circuits as described herein. In some embodiments, one or more of the circuit regions 700A-700C are included in the region 104 of the IC device 100. Corresponding components in FIGS. 2A-2F, 3A-3H, 6, 7A-7C are designated by the same reference numerals.

In FIG. 7A, the circuit region 700A comprises an input circuit 740, a master latch circuit 710, a slave latch circuit 720, and a clock circuit 730 corresponding to the input circuit 640, master latch circuit 610, slave latch circuit 620 and clock circuit 230 of the flip-flop circuit 600. The input circuit 740, master latch circuit 710, slave latch circuit 720, and clock circuit 730 are arranged in the described order along the U-axis. The clock circuit 730 is placed to be closer to the slave latch circuit 720 than to the master latch circuit 710. An electrical connection 711 is routed from the clock circuit 730 to the master latch circuit 710 for supplying the first clock signal clkb from the clock circuit 730 to the master latch circuit 710. An electrical connection 712 is routed from the clock circuit 730 to the slave latch circuit 720 for supplying the second clock signal clkbb from the clock circuit 730 to the slave latch circuit 720. The physical length and time delay of the electrical connection 711 is greater than the physical length and time delay of the electrical connection 712. As a result, in at least one embodiment, improved performance, i.e., an increased flop speed, is achievable, as described herein. In at least one embodiment, the electrical connections 711, 712 are routed to be the shortest paths (to have the smallest possible time delays) from the clock circuit 730 correspondingly to the master latch circuit 710 and the slave latch circuit 720, as permitted by various design rules for IC devices.

In the circuit region 700B in FIG. 7B, the slave latch circuit 720 is placed to be adjacent the clock circuit 730 along the U-axis, and to be adjacent the master latch circuit 710 along the V-axis. As a result, the clock circuit 730 is placed to be closer to the slave latch circuit 720 than to the master latch circuit 710. An electrical connection 721 is routed from the clock circuit 730 to the master latch circuit 710 for supplying the first clock signal clkb from the clock circuit 730 to the master latch circuit 710. The electrical connection 721 comprises a first section (not numbered) extending along the U-axis, and a second section (not numbered) extending along the V-axis. An example electrical connection having sections extending in various directions is described with respect to FIG. 9E. An electrical connection 722 is routed from the clock circuit 730 to the slave latch circuit 720 for supplying the second clock signal clkbb from the clock circuit 730 to the slave latch circuit 720. The physical length and time delay of the electrical connection 721 is greater than the physical length and time delay of the electrical connection 722. As a result, in at least one embodiment, improved performance, i.e., an increased flop speed, is achievable, as described herein. In at least one embodiment, the electrical connections 721, 722 are routed to be the shortest paths (to have the smallest possible time delays) from the clock circuit 730 correspondingly to the master latch circuit 710 and the slave latch circuit 720, as permitted by various design rules for IC devices.

In FIG. 7C, the circuit region 700C comprises a master latch circuit 781, a slave latch circuit 782, a clock circuit 783, and further circuits 785, 786. In some embodiments, the master latch circuit 781 corresponds to one or more of the master latch circuits described herein, and/or the slave latch circuit 782 corresponds to one or more of the slave latch circuits described herein, and/or the clock circuit 783 corresponds to one or more clock circuits described herein. In at least one embodiment, at least one of the further circuits 785, 786 corresponds to one or more of the further circuits 305, 306. The clock circuit 783 has an increased height, e.g., a double height, along the V-axis and is adjacent to both the master latch circuit 781 and slave latch circuit 782 along the U-axis.

To increase the time delay between the clock circuit 783 and the master latch circuit 781, an electrical connection between the master latch circuit 781 and clock circuit 783 is routed through the slave latch circuit 782, and comprises serially coupled electrical connection 792 and electrical connection 791. The electrical connection 792 is routed, along the U-axis, between the clock circuit 783 and the slave latch circuit 782. The electrical connection 791 is electrically coupled to the electrical connection 792, and is routed, along the V-axis, between the slave latch circuit 782 and the master latch circuit 781. As a result, the electrical connection between the clock circuit 783 and the master latch circuit 781 is physically longer than the shortest path between the clock circuit 783 and the master latch circuit 781, and is physically longer than the electrical connection 792 between the clock circuit 783 and the slave latch circuit 782. In at least one embodiment, the electrical connections 791, 792 are routed to be the shortest paths (to have the smallest possible time delays) from the slave latch circuit 782 correspondingly to the master latch circuit 781 and clock circuit 783, as permitted by various design rules for IC devices. Example electrical connections corresponding to the electrical connections 791, 792 are described with respect to FIG. 9E. In at least one embodiment, improved performance, i.e., an increased flop speed, is achievable, as described herein.

Figure 8B:
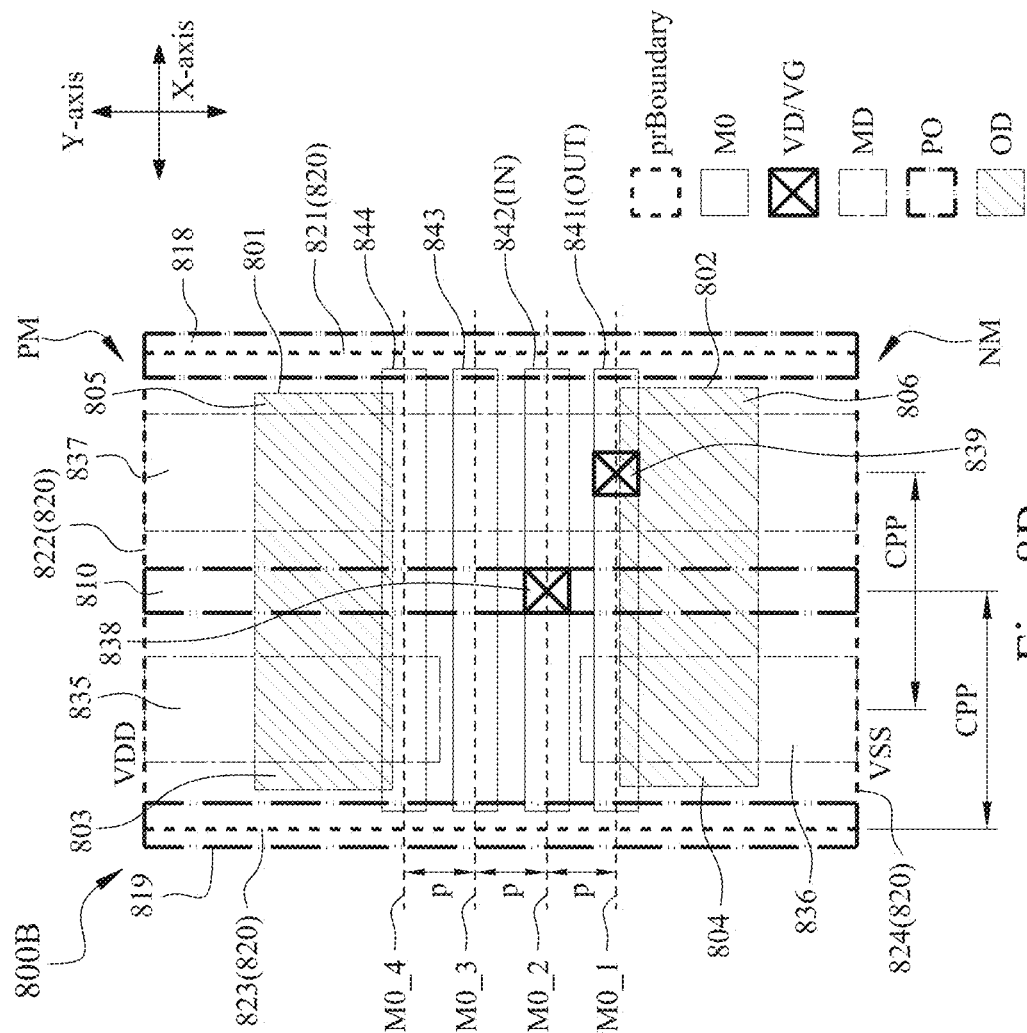
FIG. 8B is a schematic view of a layout of a cell, in accordance with some embodiments.
Figure 8A:
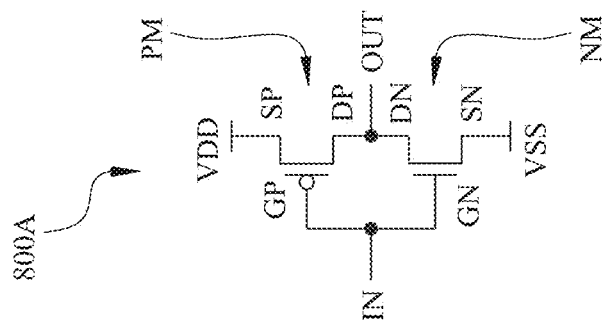
FIG. 8A is a circuit diagram of a circuit, in accordance with some embodiments.

FIG. 8A is a circuit diagram of a circuit 800A, in accordance with some embodiments. The circuit 800A comprises a PMOS transistor PM and an NMOS transistor NM. In the example configuration in FIG. 8A, the transistors PM, NM are coupled to configure the circuit 800A as an inverter corresponding to one or more of the inverters described with respect to FIGS. 2A-2F. In at least one embodiment, the transistors PM, NM are coupled to configure the circuit 800A as a transmission gate corresponding to one or more of the transmission gates described with respect to FIGS. 2A-2F.

In the inverter configuration in FIG. 8A, the transistors PM, NM are coupled in series between the power supply voltage VDD and the ground voltage VSS. Specifically, the transistor PM comprises a gate region GP, a source region SP, and a drain region DP. The transistor NM comprises a gate region GN, a source region SN, and a drain region DN. The gate regions GP, GN are coupled to an input node IN. The drain regions DP, DN are coupled to an output node OUT. The source region SP is coupled to VDD, and the source region SN is coupled to VSS.

FIG. 8B is a schematic view of a layout of a cell 800B corresponding to the circuit 800A, in accordance with some embodiments. In at least one embodiment, the cell 800B is stored as a standard cell in a standard cell library on a non-transitory computer-readable medium.

The cell 800B comprises active regions 801, 802, a gate region 810, and a boundary 820. The active regions 801, 802 are arranged inside the boundary 820, and extend along the X-axis. Active regions are sometimes referred to as oxide-definition (OD) regions, and are schematically illustrated in the drawings with the label "OD." In an IC device corresponding to the cell 800B in accordance with at least one embodiment, the active regions 801, 802 are over a first side, or a front side, of a substrate as described herein. The active regions 801, 802 include P-type dopants and/or N-type dopants to form one or more circuit elements or devices. The gate region 810 is arranged inside the boundary 820, and extends across the active regions 801, 802 along the Y-axis. The gate region 810 includes a conductive material, such as, polysilicon, and is schematically illustrated in the drawings with the label "PO." Other conductive materials for the gate region, such as metals, are within the scope of various embodiments.

The active region 801 comprises a source region 803 and a drain region 805 on opposite sides of a first section of the gate region 810 which extends over the active region 801. The source region 803, the drain region 805 and the first section of the gate region 810 correspond to the source region SP, the drain region DP, and the gate region GP described with respect to FIG. 8A. The active region 802 comprises a source region 804 and a drain region 806 on opposite sides of a second section of the gate region 810 which extends over the active region 802. The source region 804, the drain region 806 and the second section of the gate region 810 correspond to the source region SN, the drain region DN, and the gate region GN described with respect to FIG. 8A.

The boundary 820 comprises edges 821, 822, 823, 824 connected together to form a closed boundary. In a place-and-route operation (also referred to as "automated placement and routing (APR)") described herein, cells are placed in an IC layout in abutment with each other at their respective boundaries. The boundary 820 is sometimes referred to as "place-and-route boundary" and is schematically illustrated in the drawings with the label "prBoundary." In the example configuration in FIG. 8B, the boundary 820 has a rectangular shape, with the edges 821, 823 parallel to the Y-axis, and the edges 822, 824 parallel to the X-axis. Other configurations are within the scopes of various embodiments.

The cell 800B further comprises dummy gate regions 818, 819 along the corresponding edges 821, 823 of the boundary 820. In at least one embodiment, centerlines of the dummy gate regions 818, 819 coincide with the corresponding edges

821, 823 of the boundary 820. The gate region 810 is an example of "functional gate regions" which, together with the underlying active regions, configure transistors and/or are electrically coupled to one or more other circuit elements. Unlike functional gate regions, dummy gate regions, or non-functional gate regions, are not configured to form transistors together with underlying active regions, and/or one or more transistors formed by dummy gate regions together with the underlying active regions are not electrically coupled to other circuit elements. In at least one embodiment, dummy gate regions include dielectric material in a manufactured IC device. In some embodiments, dummy gate regions and functional gate regions are arranged at the same pitch CPP, i.e., a center-to-center distance, along the X-axis. In a place-and-route operation when the cell 800B is placed to abut layouts of other cells, the dummy gate regions 818, 819 along the edges 821, 823 of the boundary 820 are merged with corresponding dummy gate regions of the other cells. Other configurations are within the scopes of various embodiments. For example, in one or more embodiments, one or more of the edges 821, 823 of the boundary 820 are not arranged along the dummy gate regions 818, 819.

The cell 800B further comprises contact structures over and in electrical contact with the corresponding source/drain regions in the active regions 801, 802. Contact structures are sometimes referred to as metal-to-device structures, and are schematically illustrated in the drawings with the label "MD." An MD contact structure includes a conductive material formed over a corresponding source/drain region in the corresponding active region to define an electrical connection from one or more devices formed in the active region to other circuitry. In the example configuration in FIG. 8B, MD contact structures 835, 836 are over and in electrical contact with the corresponding source regions 803, 804, and an MD contact structure 837 extends continuously along the Y-axis to be over and in electrical contact with both corresponding drain regions 805, 806. The MD contact structure 837 electrically couples the drain regions 805, 806 together. In some embodiments, MD contact structures and gate regions (including both functional and dummy gate regions) are arranged alternatingly along the X-axis. A pitch, i.e., a center-to-center distance along the X-axis, between directly adjacent MD contact structures is the same as the pitch CPP between directly adjacent gate regions. An example conductive material of MD contact structures includes metal. Other configurations are within the scopes of various embodiments.

The cell 800B further comprises vias over and in electrical contact with the corresponding gate regions or MD contact structures. A via over and in electrical contact with an MD contact structure is sometimes referred to as via-to-device (VD). A via over and in electrical contact with a gate region is sometimes referred to as via-to-gate (VG). VD and VG vias are schematically illustrated in the drawings with the label "VD/VG." In the example configuration in FIG. 8B, a VG via 838 is over and in electrical contact with the gate region 810, and a VD via 839 is over and in electrical contact with the MD contact structure 837. An example material of the VD and VG vias includes metal. Other configurations are within the scopes of various embodiments.

The cell 800B further comprises one or more metal layers and via layers sequentially and alternatingly arranged over the VD and VG vias. The lowermost metal layer immediately over and in electrical contact with the VD and VG vias is a metal-zero (M0) layer. In other words, the M0 layer is the lowermost metal layer over, or the closest metal layer to, the active regions 801, 802 on the front side of the substrate. A next metal layer immediately over the M0 layer is a metal-one (M1) layer, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Metal layers, such as M0, M1, or the like, and via layers, such as V0, V1, or the like, on the front side of the substrate are referred to herein as front side metal layers and front side via layers.

In the example configuration in FIG. 8B, the cell 800B comprises, in the M0 layer, M0 conductive patterns 841, 842, 843, 844 along corresponding tracks M0_1, M0_2, M0_3, M0_4. The tracks M0_1, M0_2, M0_3, M0_4 or the like are also referred to herein as M0 tracks. The tracks M0_1, M0_2, M0_3, M0_4 and the corresponding M0 conductive patterns 841, 842, 843, 844 extend along the X-axis and are spaced from each other along the Y-axis. In the example configuration in FIG. 8B, the tracks M0_1, M0_2, M0_3, M0_4 are spaced from each other along the Y-axis by a pitch p, and coincide with center lines of the corresponding M0 conductive patterns 841, 842, 843, 844. The tracks M0_1, M0_2, M0_3, M0_4 define locations where M0 conductive patterns are formed in the M0 layer to ensure that predetermined design rules are satisfied. The number of four tracks of M0 conductive patterns over the cell 800B is an example. Other numbers of tracks of M0 conductive patterns over a cell are within the scopes of various embodiments.

The M0 conductive patterns 841, 842, 843, 844 are configured to electrically couple various devices in the cell 800B into internal circuitry of the cell 800B, and/or to electrically couple the internal circuitry with external circuitry, e.g., to other cells of an IC device. For example, the M0 conductive pattern 841 overlaps and is electrically coupled to the VD via 839, and the M0 conductive pattern 842 overlaps and is electrically coupled to the VG via 838. As a result, the M0 conductive pattern 841 is electrically coupled to the drain regions 805, 806 through the MD contact structure 837 and the VD via 839, and the M0 conductive pattern 842 is electrically coupled to the gate region 810 through the VG via 838. The M0 conductive pattern 841 corresponds to the output node OUT in FIG. 8A. The M0 conductive pattern 842 corresponds to the input node IN in FIG. 8A. The M0 conductive patterns 843, 844 are floating M0 conductive patterns. Other configurations are within the scopes of various embodiments.

In an example, when the cell 800B is used as the inverter INVB in the clock circuit 230, the M0 conductive pattern 841 corresponds to the clock output 232 and the M0 conductive pattern 842 corresponds to the clock output 231. In another example, when a transmission gate cell similar to the cell 800B is used as the transmission gate TG1m, the internal connections of the transmission gate cell differ from the cell 800B in that each of the M0 conductive patterns 841-844 is configured as a different input or output, such as, a clock input for the first clock signal clkb, a clock input for the second clock signal clkbb, a data input for the data D, and a data output for coupling to the node ml_ax or 212. Other configurations are within the scopes of various embodiments.

In some embodiments, the cell 800B comprises one or more metal layers and via layers on a back side of the substrate, for connections to power supply voltages, internal connections among devices of the cell 800B, and/or external connections to other cells. Details of backside metal layers and backside via layers are described with respect to FIG. 8C.

Figure 8C:
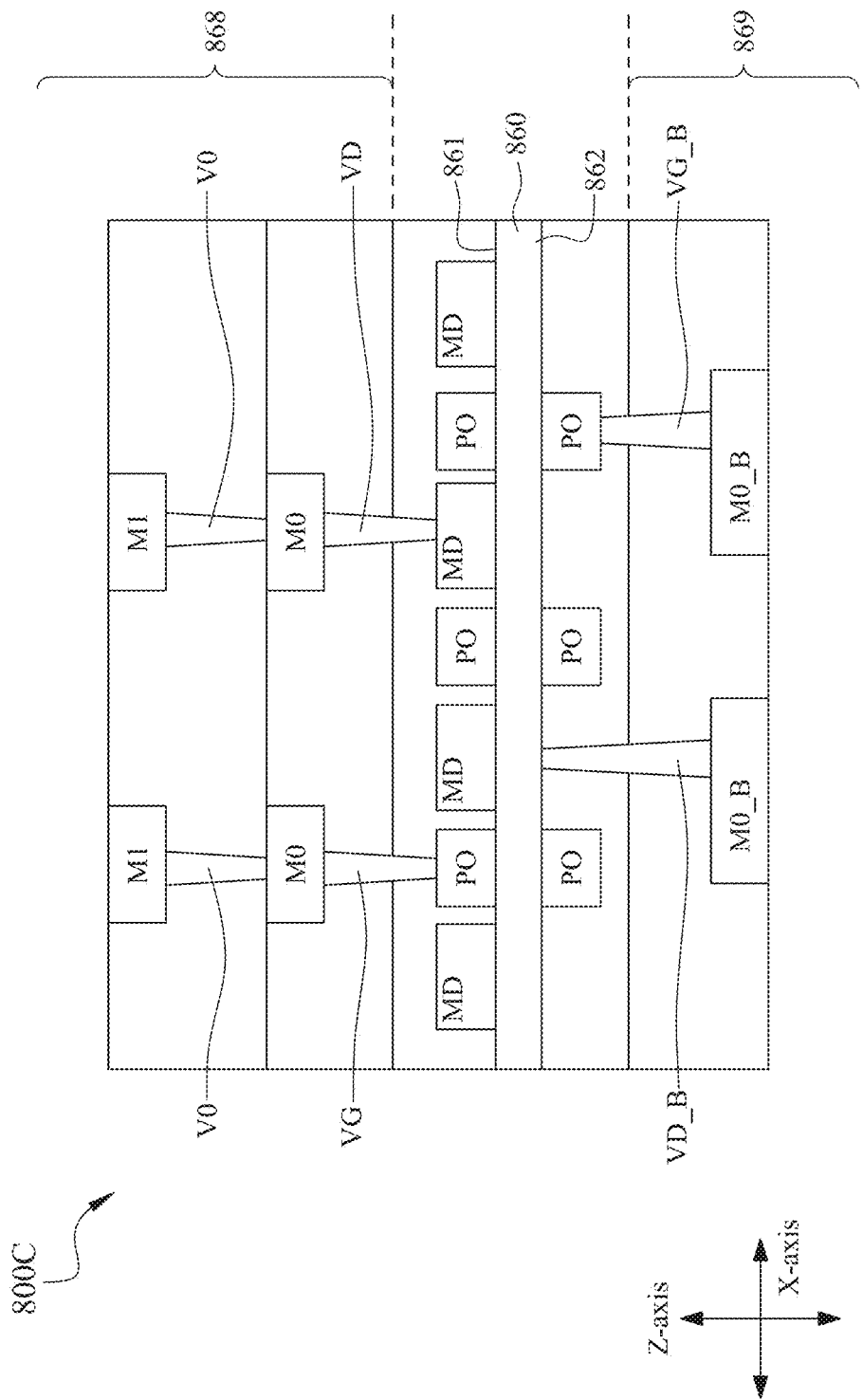
FIG. 8C is a schematic cross-sectional view of a circuit region of an IC device, in accordance with some embodiments.

FIG. 8C is a schematic cross-sectional view of a circuit region of an IC device 800C, in accordance with some embodiments. The IC device 800C comprises one or more cells, such as the cell 800B.

As shown in FIG. 8C, the IC device 800C comprises a substrate 860 over which circuit elements and structures corresponding to one or more cells are formed. The substrate 860 has a first side 861 and a second side 862 opposite one another along the thickness direction of the substrate 860, i.e., along a Z-axis. In at least one embodiment, the first side 861 is referred to as "upper side" or "front side" or "device side," whereas the second side 862 is referred to as "lower side" or "back side." The substrate 860 comprises, in at least one embodiment, silicon, silicon germanium (SiGe), gallium arsenic, or other suitable semiconductor or dielectric materials.

The IC device 800C further comprises N-type and P-type dopants added to the substrate 860 to correspondingly form NMOS active regions and PMOS active regions, schematically designated in FIG. 8C with the label "OD." In some embodiments, isolation structures are formed between adjacent active regions. For simplicity, isolation structures are omitted from FIG. 8C. In at least one embodiment, the active regions in FIG. 8C correspond to one or more of the active regions 801, 802 described with respect to FIG. 8B.

The IC device 800C further comprises various gate structures over the active regions on at least one of the front side 861 or the back side 862. In the example configuration in FIG. 8C, gate structures, designated with the label "PO," are over the active regions on both of the front side 861 or the back side 862. In at least one embodiment, gate structures are over the active regions on the front side 861, but not on the back side 862. One or more gate dielectric layers (not shown) are between the active regions and each gate structure. Example materials of the gate dielectric layer or layers include HfO2, ZrO2, or the like. Example materials of the gate structures include polysilicon, metal, or the like. In some embodiments, the gate structures correspond to one or more of the gate region, 810, 818, 819, as described with respect to FIG. 8B. In at least one embodiment, gate structures corresponding to dummy gate regions include dielectric materials.

The IC device 800C further comprises MD contact structures for electrically coupling source/drains of various transistors in the active regions to other circuit elements. In some embodiments, at least one of the MD contact structures corresponds to one or more of MD contact structures 835-837, as described with respect to FIG. 8B. The IC device 800C further comprises VD vias and VG vias correspondingly over and in electrical contact with MD contact structures and gate structures.

The IC device 800C further comprises, on the front side 861, an interconnect structure (also referred to as "redistribution structure") 868 which is over the VD and VG vias, and comprises a plurality of metal layers M0, M1, . . . and a plurality of via layers V0, V1, . . . arranged alternatingly in the thickness direction of the substrate 860, i.e., along the Z-axis. The interconnect structure 868 further comprises various interlayer dielectric (ILD) layers (not shown or not numbered) in which the metal layers and via layers are embedded. The metal layers and via layers of the interconnect structure 868 are configured to electrically couple various elements or circuits of the IC device 800C with each other, and with external circuitry. For simplicity, metal layers and via layers above the M1 layer are omitted in FIG. 8C.

The IC device 800C further comprises, on the back side 862, a back side interconnect structure 869 which comprises at least one back side metal layer, such as a back-side-metal-zero (BM0 or M0_B) layer under the back side 862 of the substrate 860. On the back side 862 of the substrate 860, the M0_B layer is the uppermost metal layer under, or the closest metal layer to, the active regions or source/drains of the transistors of the IC device 800C. Conductive patterns in the M0_B layer are coupled to the active regions by one or more VD_B vias, and/or to gate structures PO by one or more VG_B vias. In at least one embodiment, the IC device 800C comprises one or more further via layers, dielectric layers and metal layers (not shown) under the M0_B layer to form interconnections among circuit elements of the IC device 800C and/or to form electrical connections to external circuitry. Via layers and metal layers from the M0_B layer and below are sometimes referred to as back side via layers and back side metal layers. An example material of back side vias and back side metal layers includes metal. Other configurations are within the scopes of various embodiments. For simplicity, dielectric layers, back side via layers, and back side metal layers lower than the M0_B layer are omitted from FIG. 8C.

In some embodiments, one or more of the layouts described with respect to FIGS. 3A-3H, 5A-5B, 7A-7C comprise various cells each including PMOS, NMOS transistors having the layouts described with respect to FIG. 8A. The PMOS, NMOS transistors in each cell are coupled to configure the cell as an inverter, master latch circuit, slave latch circuit, multiplexer, or the like. For example, in FIG. 3A, master latch circuit 310 is a cell, slave latch circuit 320 is another cell, and clock circuit 330 is a further cell. The cells are placed into a layout of the circuit region 300A in the described manner. Clock nets, e.g., electrical connections from a clock circuit to a master latch circuit or slave latch circuit, are routed in one or more metal layers and/or via layers of at least one of the interconnect structure 868 or the back side interconnect structure 869. Example electrical connections routed in the interconnect structure 868 on the front side 861 of the substrate 860 are described with respect to FIGS. 9A-9E. In some embodiments, electrical connections routed in the back side interconnect structure 869 are similarly configured.

FIGS. 9A-9E are schematic perspective views of various conductive structures 900A-900E configuring electrical connections for routing clock signals, in accordance with some embodiments.

Figure 9B:
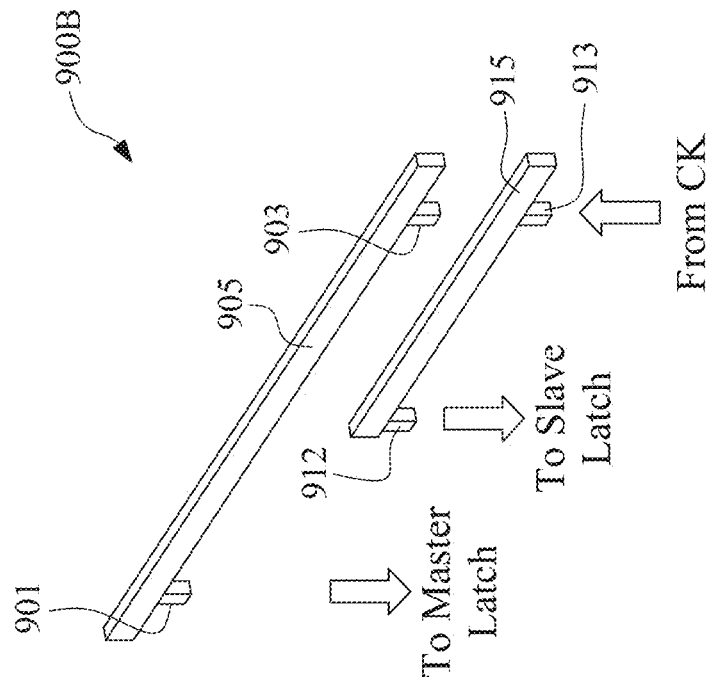
FIGS. 9A-9E are schematic perspective views of various conductive structures configuring electrical connections for routing clock signals, in accordance with some embodiments.
Figure 9A:
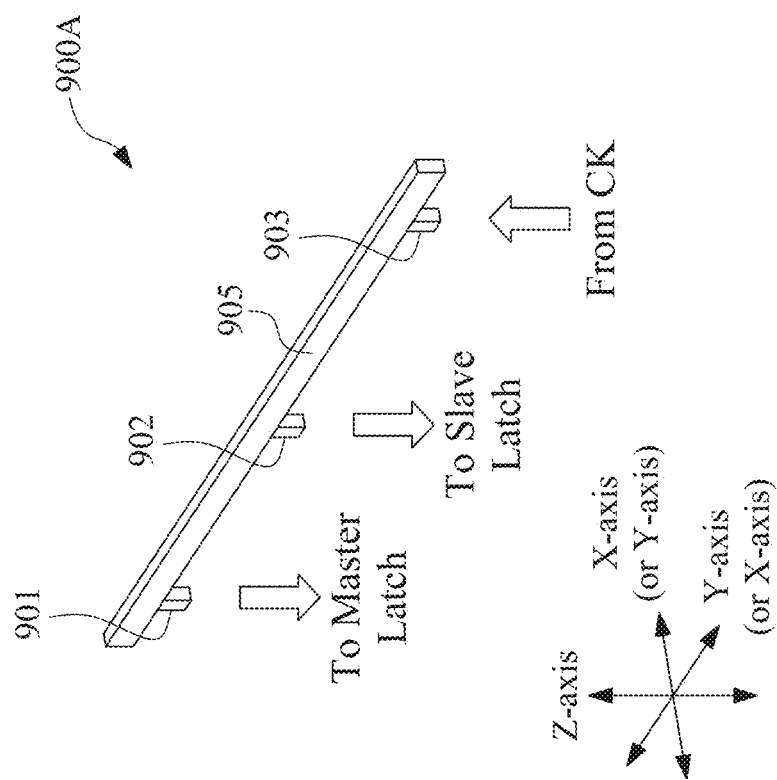

In FIG. 9A, the conductive structure 900A comprises a conductive pattern 905 in a metal layer Mk+1, where k is an integer. The conductive pattern 905 is coupled to a master latch circuit, a slave latch circuit, and a clock circuit correspondingly by vias 901, 902, 903 in the via layer Vk. A physical length of the conductive pattern 905 between the vias 901, 903 corresponds to an electrical connection for supplying a clock signal (e.g., clkb or clkbb) from the clock circuit to the master latch circuit. A physical length of the conductive pattern 905 between the vias 902, 903 corresponds to an electrical connection for supplying the clock signal from the clock circuit to the slave latch circuit. The electrical connection for supplying the clock signal from the clock circuit to the master latch circuit has a greater physical length and a greater time delay than the electrical connection for supplying the clock signal from the clock circuit to the slave latch circuit. As a result, in at least one embodiment, improved performance, e.g., increased speed, is achievable. In some embodiments, the conductive structure 900A corresponds to the electrical connections 311, 312, the electrical connections 313, 314, or the like, as described with respect to FIGS. 3A-3D, 5A.

In FIG. 9B, the conductive structure 900B comprises conductive patterns 905, 915 both in the metal layer Mk+1. The conductive pattern 905 is coupled to a master latch circuit, and a clock circuit correspondingly by vias 901 and 903 in the via layer Vk. The conductive pattern 915 is coupled to a slave latch circuit, and the clock circuit correspondingly by vias 912 and 913 in the via layer Vk. The conductive pattern 905 corresponds to an electrical connection for supplying a clock signal from the clock circuit to the master latch circuit, and the conductive pattern 915 corresponds to an electrical connection for supplying the clock signal from the clock circuit to the slave latch circuit. A physical length and time delay of the conductive pattern 905 for supplying the clock signal from the clock circuit to the master latch circuit are greater than the physical length and time delay of the conductive pattern 915 for supplying the clock signal from the clock circuit to the slave latch circuit. As a result, in at least one embodiment, improved performance, e.g., increased speed, is achievable. In some embodiments, the conductive structure 900B corresponds to the electrical connections 311, 312, the electrical connections 313, 314, or the like, as described with respect to FIGS. 3A-3D, 5A.

Figure 9C:
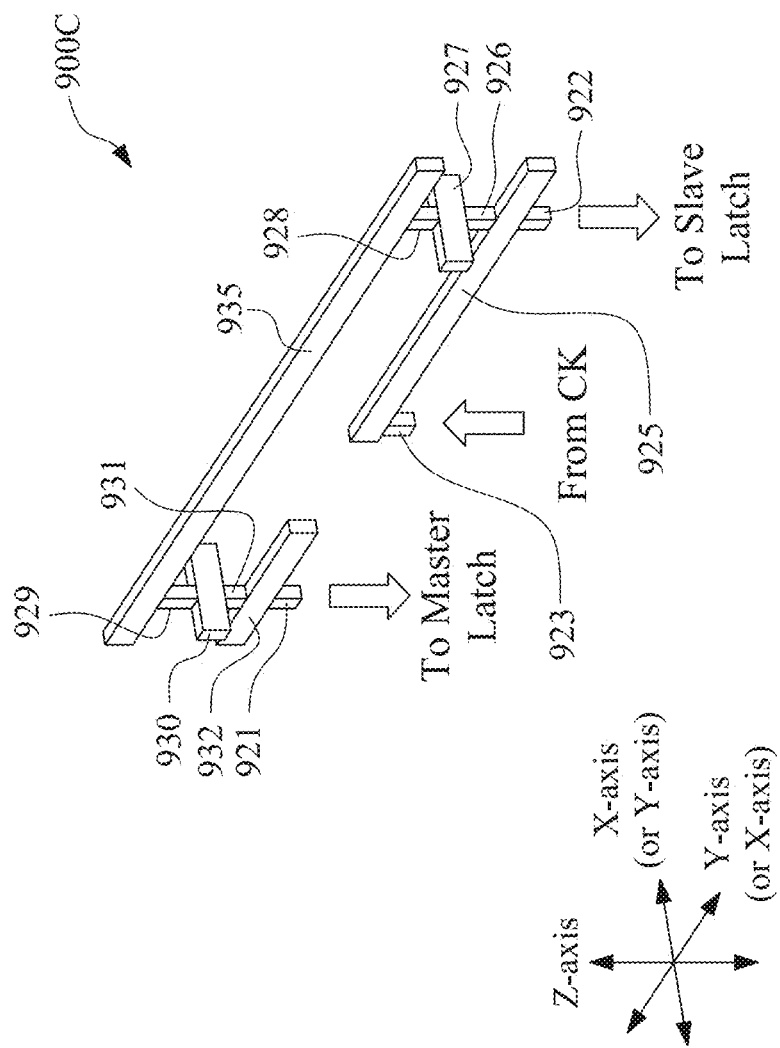

In FIG. 9C, the conductive structure 900C comprises a conductive pattern 925 in the metal layer Mk+1. The conductive pattern 925 is coupled to a slave latch circuit, and a clock circuit correspondingly by vias 922 and 923 in the via layer Vk. The conductive pattern 925 corresponds to an electrical connection for supplying a clock signal from the clock circuit to the slave latch circuit.

The conductive structure 900C further comprises a conductive pattern 935 in the metal layer Mk+3. An end of the conductive pattern 935 is coupled to an underlying end of the conductive pattern 925 by a via 928 of the via layer Vk+2, a conductive pattern 927 of the metal layer Mk+2, and a via 926 of the via layer Vk+1. Another end of the conductive pattern 935 is coupled to a master latch circuit by a via 929 of the via layer Vk+2, a conductive pattern 930 of the metal layer Mk+2, a via 931 of the via layer Vk+1, a conductive pattern 932 of the metal layer Mk+1, and a via 921 of the via layer Vk. The conductive patterns in the metal layer Mk+2 extend along one of the X-axis and the Y-axis, whereas the conductive patterns in the metal layers Mk+1 and Mk+3 extend along the other of the X-axis and the Y-axis.

The conductive patterns 925, 935 together form an electrical connection for supplying the clock signal from the clock circuit to the master latch circuit, with a physical length and time delay greater than the physical length and time delay of the electrical connection for supplying the clock signal from the clock circuit to the slave latch circuit. As a result, in at least one embodiment, improved performance, e.g., increased speed, is achievable. In some embodiments, the conductive structure 900C corresponds to the electrical connections 351, 352, the electrical connections 353, 354, the electrical connections 551, 552, or the electrical connections 553, 554, as described with respect to FIGS. 3E, 3G, 5B.

Figure 9D:
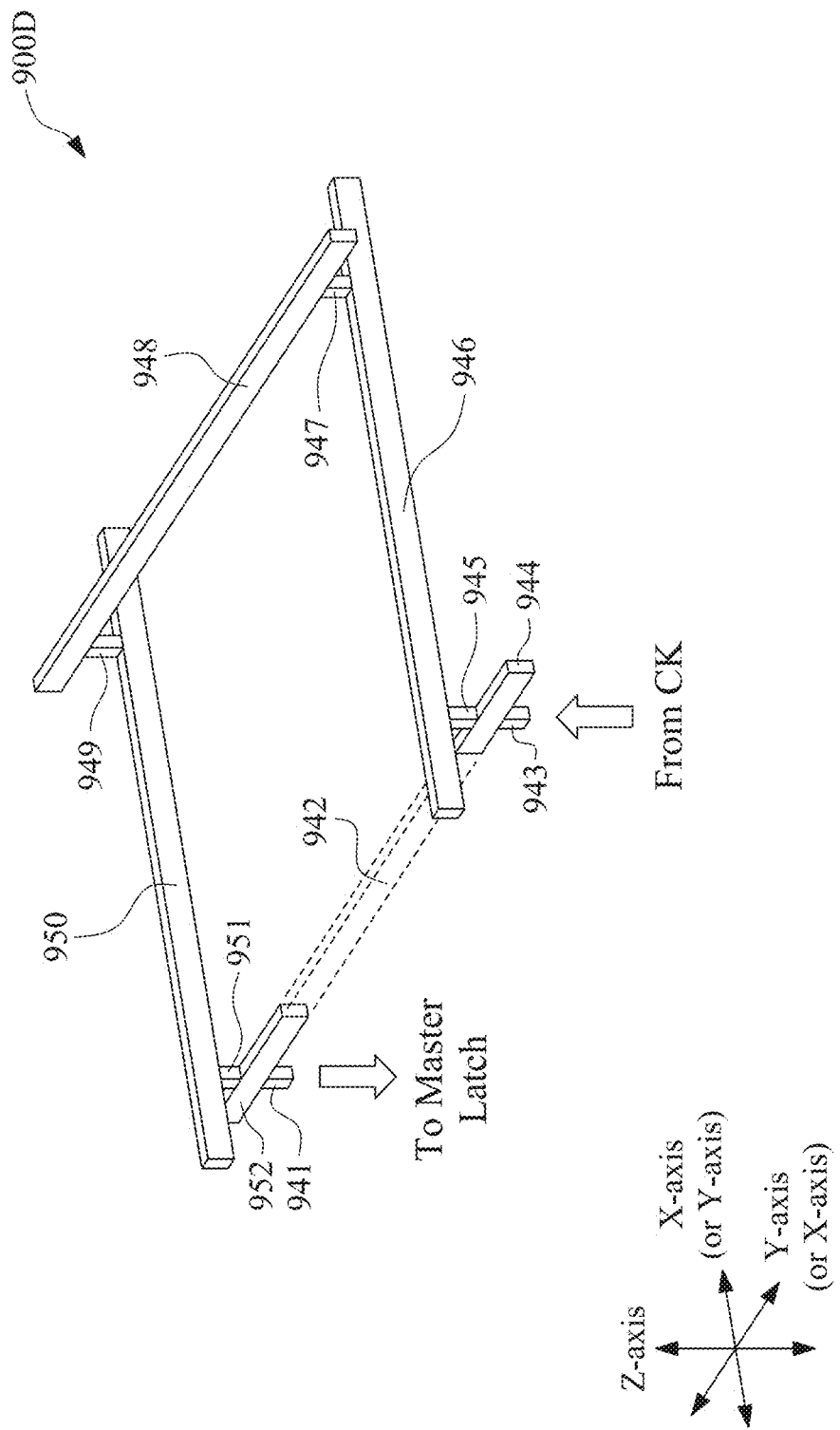

In FIG. 9D, the conductive structure 900D corresponds to an electrical connection for supplying a clock signal from a clock circuit to a master latch circuit, with redundant routing. Instead of routing a conductive pattern in the metal layer Mk+1 along the shortest path 942 for electrically coupling the clock circuit and the master latch circuit, the conductive structure 900D comprises redundant routing.

In the conductive structure 900D, the clock circuit is coupled to a via 943 in the via layer Vk, then to a conductive pattern 944 in the metal layer Mk+1, then to a via 945 in the via layer Vk+1, then to an end of a conductive pattern 946 in the metal layer Mk+2. Another end of the conductive pattern 946 is coupled to a via 947 in the via layer Vk+2, then to an end of a conductive pattern 948 in the metal layer Mk+3. Another end of the conductive pattern 948 is coupled to a via 949 in the via layer Vk+2, then to an end of a conductive pattern 950 in the metal layer Mk+2. Another end of the conductive pattern 950 is coupled to a via 951 in the via layer Vk+1, then to a conductive pattern 952 in the metal layer Mk+1, then to the master latch circuit by a via 941 in the via layer Vk. In some embodiments, the conductive pattern 948 is in the metal layer Mk+1, and the vias 947, 949 are in the via layer Vk+1.

A physical length of the conductive pattern 948 is about the same as the physical length of the shortest path 942, and the physical lengths of the conductive patterns 946, 950 provide redundant routing, to increase the physical length and time delay of the electrical connection from the clock circuit to the master latch circuit. As a result, in at least one embodiment, improved performance, e.g., increased speed, is achievable. In some embodiments, the conductive structure 900D corresponds to one or more of the electrical connections 341, 361, 363, as described with respect to FIGS. 3D, 3F, 3H.

Figure 9E:
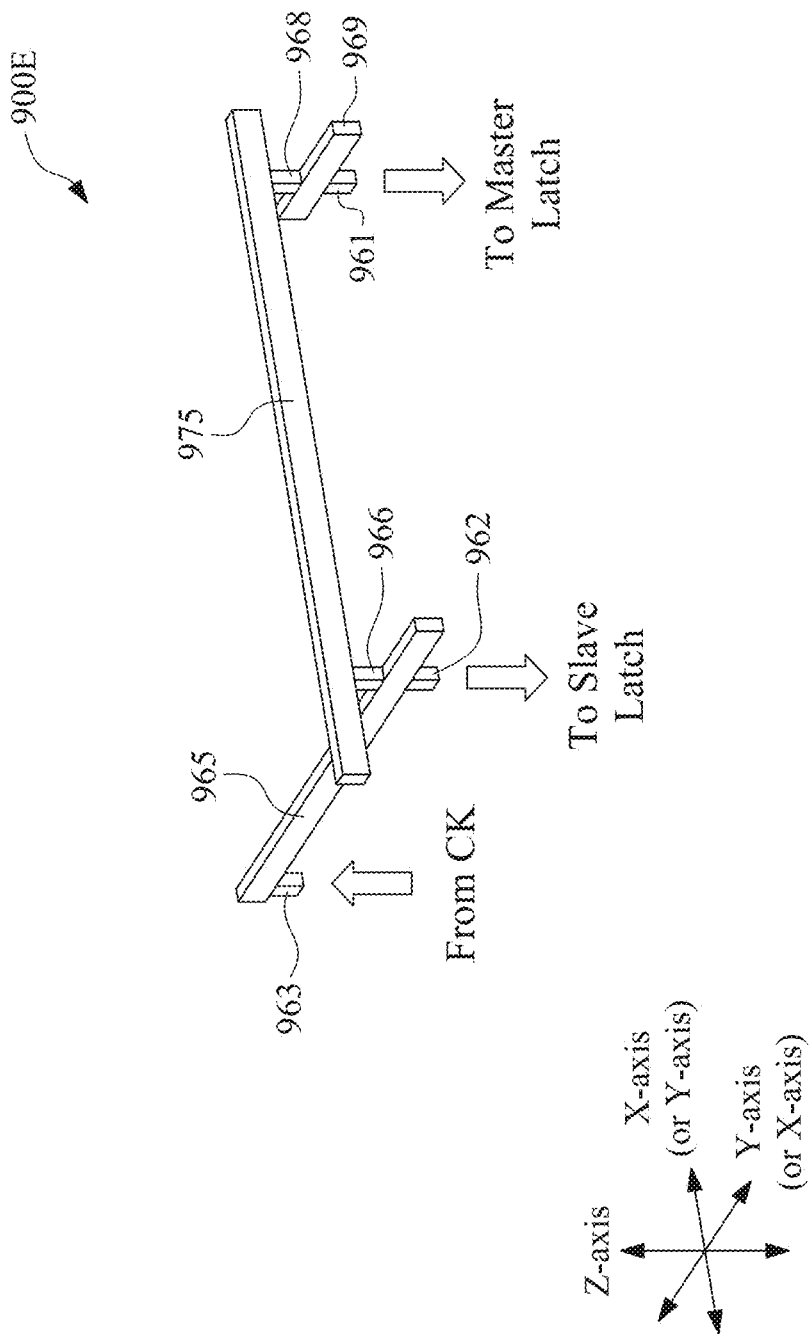

In FIG. 9E, the conductive structure 900E comprises a conductive pattern 965 in the metal layer Mk+1. The conductive pattern 965 is coupled to a slave latch circuit, and a clock circuit correspondingly by vias 962 and 963 in the via layer Vk. The conductive pattern 965 corresponds to an electrical connection for supplying a clock signal from the clock circuit to the slave latch circuit.

The conductive structure 900E further comprises a conductive pattern 975 in the metal layer Mk+2. An end of the conductive pattern 975 is coupled to an underlying end of the conductive pattern 965 by a via 966 of the via layer Vk+1. Another end of the conductive pattern 975 is coupled to a master latch circuit by a via 968 of the via layer Vk+1, a conductive pattern 969 of the metal layer Mk+1, and a via 961 of the via layer Vk.

The conductive patterns 965, 975 together form an electrical connection for supplying the clock signal from the clock circuit to the master latch circuit, with a physical length and time delay greater than the physical length and time delay of the electrical connection for supplying the clock signal from the clock circuit to the slave latch circuit. As a result, in at least one embodiment, improved performance, e.g., increased speed, is achievable. In some embodiments, the conductive structure 900E corresponds to the electrical connection 721, or the electrical connections 791, 792, as described with respect to FIGS. 7B, 7C.

Figure 10A:
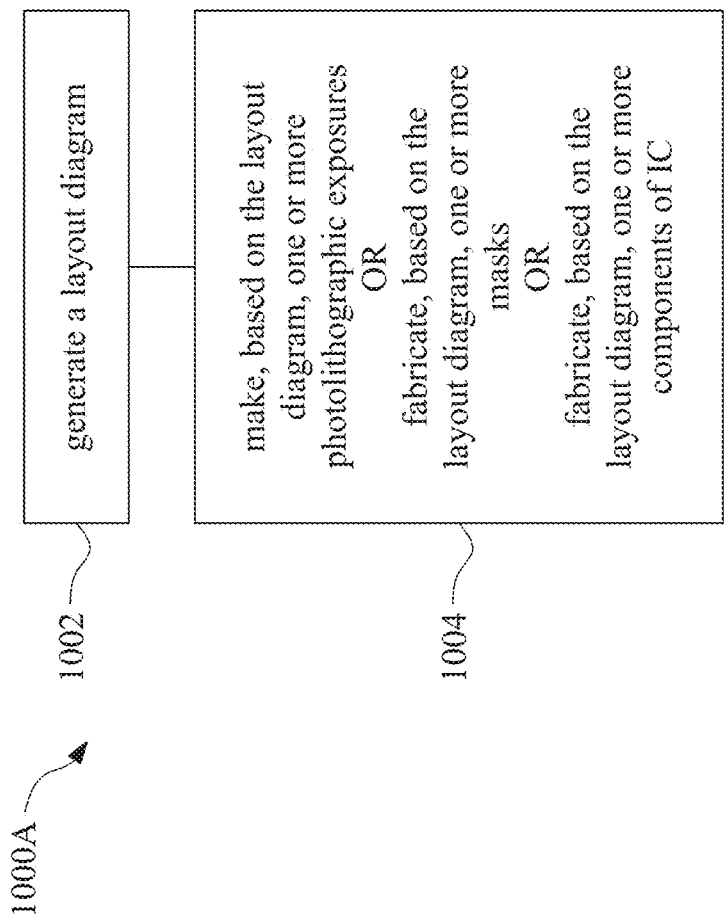
FIGS. 10A-10D are flowcharts of various methods, in accordance with some embodiments.

FIG. 10A is a flowchart of a method 1000A of generating a layout and using the layout to manufacture an IC device, in accordance with some embodiments.

Method 1000A is implementable, for example, using EDA system 1100 (FIG. 11, discussed below) and an integrated circuit (IC) manufacturing system 1200 (FIG. 12, discussed below), in accordance with some embodiments. Regarding method 1000A, examples of the layout include the layouts disclosed herein, or the like. Examples of an IC device to be manufactured according to method 1000A include the IC devices disclosed herein. In FIG. 10A, method 1000A includes operations 1002, 1004.

At operation 1002, a layout is generated which, among other things, include patterns represent one or more circuit regions as described with respect to FIGS. 3A-3H, 5A-5B, 7A-7C, 8B, or the like. Operation 1002 is discussed in more detail below with respect to FIG. 10B. From operation 1002, flow proceeds to operation 1004.

At operation 1004, based on the layout, at least one of (A) one or more photolithographic exposures are made or (b) one or more semiconductor masks are fabricated or (C) one or more components in a layer of an IC device are fabricated. Operation 1004 is discussed in more detail below with respect to FIG. 10C.

Figure 10B:
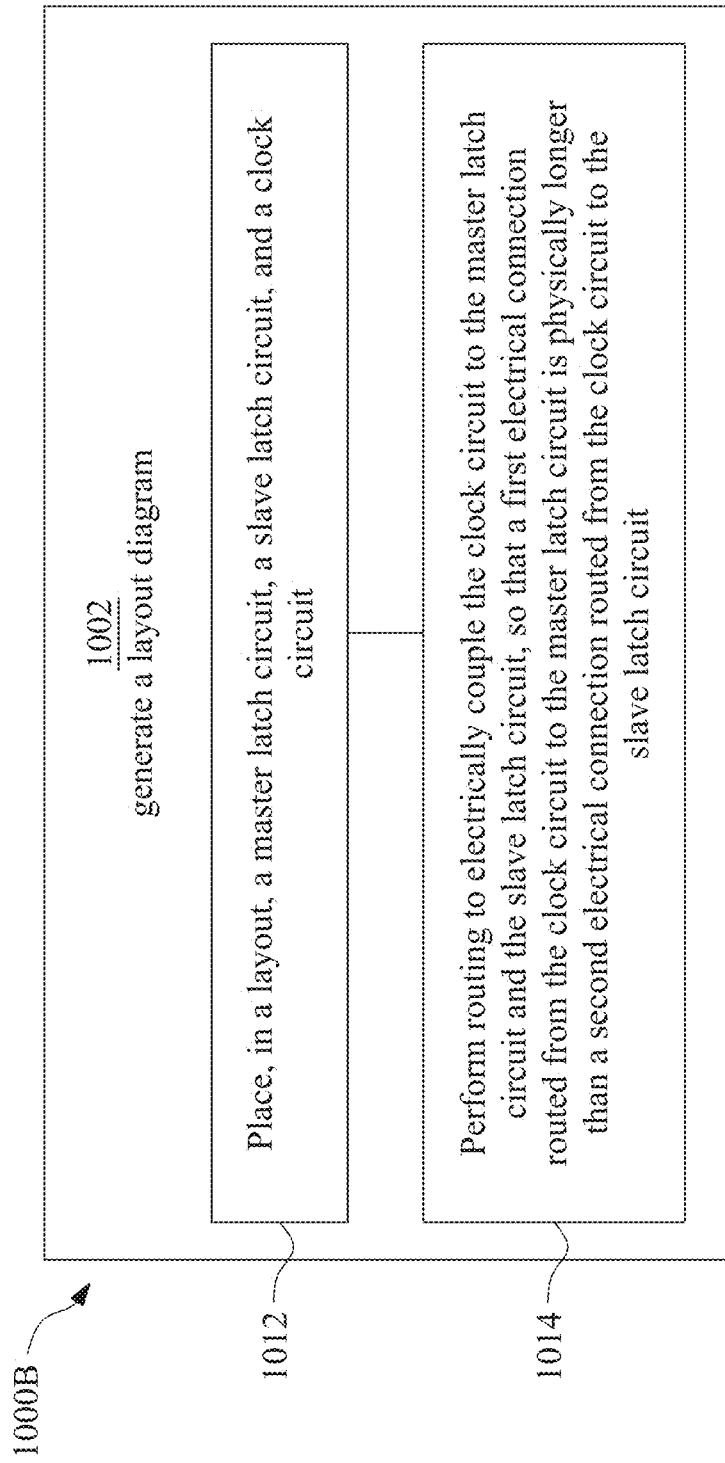

FIG. 10B is a flowchart of a method 1000B of generating a layout, in accordance with some embodiments. More particularly, the flowchart of FIG. 10B shows additional operations that demonstrates one example of procedures implementable in operation 1002 of FIG. 10A, in accordance with one or more embodiments. In FIG. 10B, operation 1002 includes operations 1012, 1014.

At operation 1012, a master latch circuit, a slave latch circuit, and a clock circuit are placed in a layout, e.g., in a placement operation by an APR tool or system. For example, each of the master latch circuit, slave latch circuit, and clock circuit is a cell retrieved from one or more cell libraries. Alternatively, a combination of more than one of the master latch circuit, slave latch circuit, and clock circuit is included in a cell retrieved from one or more cell libraries. The master latch circuit, slave latch circuit, and clock circuit are placed in the layout, in one or more manners described with respect to FIGS. 3A-3H, 5A-5B, 7A-7C.

At operation 1014, routing is performed to electrically couple the clock circuit to the master latch circuit and the slave latch circuit, e.g., in a routing operation by the APR tool or system. As a result of the routing, a first electrical connection routed from the clock circuit to the master latch circuit is physically longer, and therefore, has a greater time delay, than a second electrical connection routed from the clock circuit to the slave latch circuit. As a result, in at least one embodiment, improved performance, e.g., increased speed, is achievable. In at least one embodiment, the generated layout of the IC device is stored on a non-transitory computer-readable medium.

In some embodiments, in the placement operation, the clock circuit is physically placed to be closer to the slave latch circuit than to the master latch circuit, for example, as described with respect to FIGS. 3A-3D, 5A, 7A, 7B. As a result, when routing is performed, in accordance with some embodiments, it is easy to obtain an electrical connection routed from the clock circuit to the master latch circuit to be physically longer, and with a greater time delay, than an electrical connection routed from the clock circuit to the slave latch circuit.

In some embodiments, even when the placement operation is performed without necessarily placing the clock circuit closer to the slave latch circuit than the master latch circuit, it is possible to perform the routing operation so that the electrical connection routed from the clock circuit to the master latch circuit is physically longer, and has a greater time delay, than an electrical connection routed from the clock circuit to the slave latch circuit. In at least one embodiment, the electrical connection from the clock circuit to the master latch circuit is routed through a region of the slave latch circuit before reaching the master latch circuit to increase the distance or electrical path from the clock circuit to the master latch circuit, as described with respect to FIGS. 3A-3E, 3G, 5A-5B, 7A-7C. In at least one embodiment, redundant routing is added between the clock circuit and the master latch to increase the distance or electrical path from the clock circuit to the master latch circuit, as described with respect to FIGS. 3F, 3H.

Figure 10C:
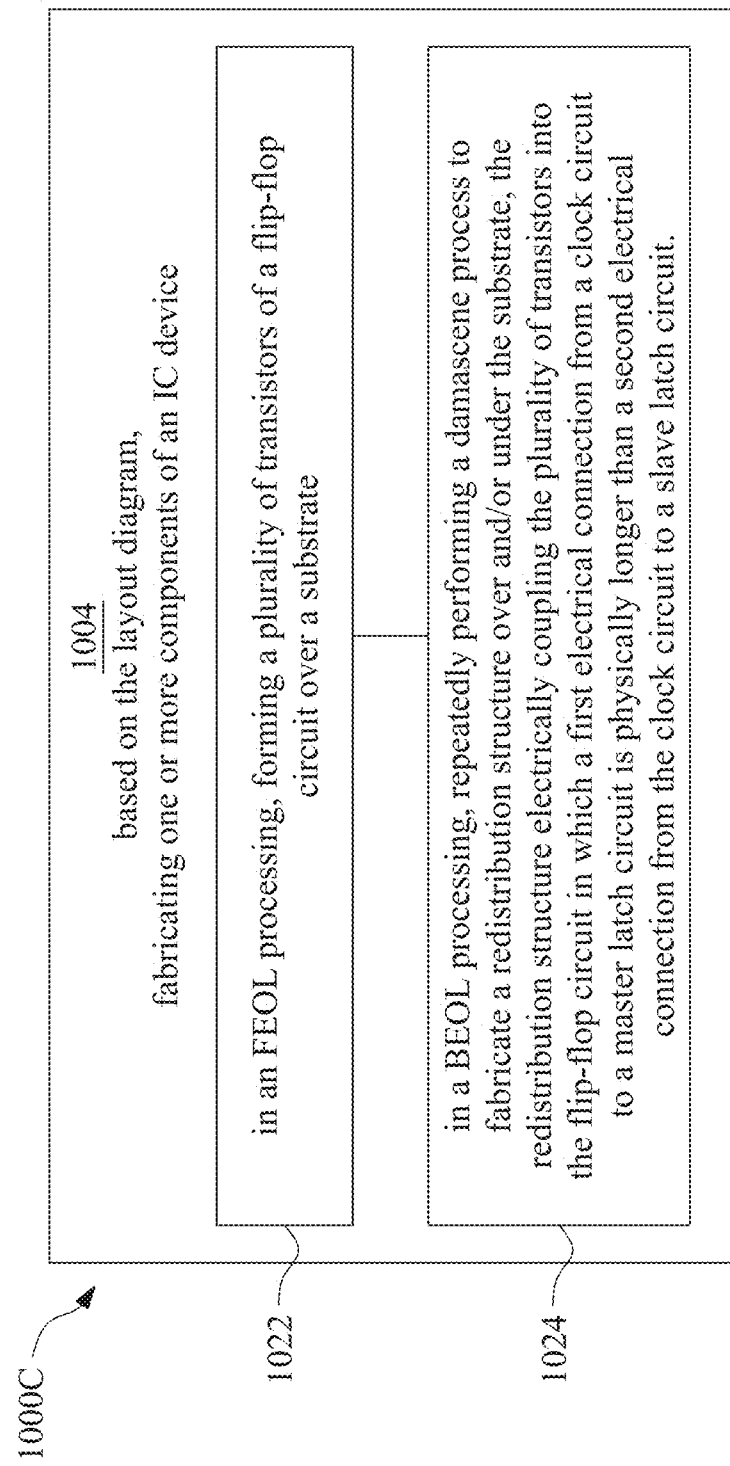

FIG. 10C is a flowchart of a method 1000C of fabricating one or more components of an IC device, based on the layout, in accordance with some embodiments. More particularly, the flowchart of FIG. 10C shows additional operations that demonstrates one example of procedures implementable in operation 1004 of FIG. 10A, in accordance with one or more embodiments.

At operation 1022, in an FEOL processing, a plurality of transistors of a flip-flop circuit are formed over a substrate, for example, as described with respect to FIGS. 3A-3H, 5A-5B, 7A-7C, 8C.

For example, the manufacturing process starts from a substrate, such as the substrate 860. The substrate 860 comprises, in at least one embodiment, a silicon substrate. The substrate 860 comprises, in at least one embodiment, silicon germanium (SiGe), gallium arsenic, or other suitable semiconductor materials. In some embodiments, multiple active regions are formed in the substrate 860. Isolation structures (not shown) are formed in the substrate 860, e.g., by etching corresponding areas of the substrate 860 and filling the etched areas with insulating material.

Various transistors are formed over the substrate 860 in a front-end-of-line (FEOL) processing. For example, a gate dielectric is deposited over the substrate 860 having the active regions. Example materials of the gate dielectric include, but are not limited to, silicon oxide such as thermally grown silicon oxide, a high-k dielectric such as a metal oxide, or the like. Example high-k dielectrics include, but are not limited to, HfO2, Ta2O5, Al2O3, TiO2, TiN, ZrO2, SnO, SnO2, or the like. In some embodiments, the gate dielectric is deposited over the substrate 860 by atomic layer deposition (ALD) or other suitable techniques. A gate material is deposited or formed over the gate dielectric. Example materials of the gate material include, but are not limited to, polysilicon, metal, Al, AlTi, Ti, TiN, TaN, Ta, TaC, TaSIN, W, WN, MON, and/or other suitable conductive materials. In some embodiments, the gate material is deposited by chemical vapor deposition (CVD), physical vapor deposition (PVD or sputtering), plating, atomic layer deposition (ALD), and/or other suitable processes. The gate dielectric and gate material are patterned into a plurality of gate structures, each comprising a gate electrode and a underlying gate dielectric layer. In some embodiments, the patterning of the gate dielectric and gate material includes a photolithography operation.

The gate structures are used a mask to perform ion implantation in various regions of the active regions adjacent the gate structures, to obtain source/drain regions which comprise N+ implanted regions in a P-well or P-substrate to form N-type transistors, and/or P+ implanted regions in an N-well or N-substrate to form P-type transistors. Other types of implantation and/or well are within the scopes of various embodiments. In some embodiments, a spacer (not shown) is deposited around each gate structure. Various MD contact structures and/or VD/VG vias are correspondingly formed, e.g., by deposition of a conductive material in to spaces between the spacers and/or gate structures, over the source/drain regions.

At operation 1024, in a BEOL processing, a damascene process is repeatedly performed to fabricate a redistribution structure over and/or under the substrate, the redistribution structure electrically coupling the plurality of transistors into the flip-flop circuit in which a first electrical connection from a clock circuit to a master latch circuit is physically longer than a second electrical connection from the clock circuit to a slave latch circuit, as described with respect to FIGS. 3A-3H, 5A-5B, 7A-7C, 8A-8C, 9A-9E.

For example, after the FEOL processing, a back-end-of-line (BEOL) processing is performed to form a redistribution structure 868 over the substrate 860 and/or a backside redistribution structure 869 under the substrate 860. In at least one embodiment, fabricating the redistribution structure 868 comprises sequentially overlying metal and via layers. The overlying metal layers and via layers correspondingly comprise metal layers M0, M1, or the like, and via layers V0, V1, or the like. In at least one embodiment, the redistribution structure 868 is manufactured sequentially layer by layer upward from the substrate 860, for example, by repeatedly performing a damascene process. In such a damascene process, a dielectric layer is deposited over the substrate 860 with various transistors and contact features formed thereon. The dielectric layer is patterned to form a damascene structure having underlying via holes corresponding to conductive vias of a via layer Vj to be formed later, and overlying recessed features corresponding to conductive patterns of a metal layer Mj+1 to be formed later, where j is an integer. An example patterning process to form the damascene structure comprises two or more photolithographic patterning and anisotropic etching steps to first form the underlying via holes, then form the overlying recessed features. A conductive material is deposited over the substrate 860 to fill in the damascene structure to obtain the conductive vias in the via layer Vj and overlying conductive patterns in the metal layer Mj+1. The described damascene process is performed one or more times to sequentially form vias and conductive patterns of higher via layers and metal layers of the redistribution structure 868 until a top metal layer is completed. The backside redistribution structure 869 is fabricated in a similar manner.

In the fabricated redistribution structure 868 and/or backside redistribution structure, 869, a first electrical connection from a clock circuit to a master latch circuit of the flip-flop circuit is physically longer than a second electrical connection from the clock circuit to a slave latch circuit of the flip-flop circuit. Example electrical connections with increased physical lengths in a redistribution structure are described with respect to FIGS. 9A-9E. In at least one embodiment, improved performance, e.g., increased speed, is achievable.

Figure 10D:
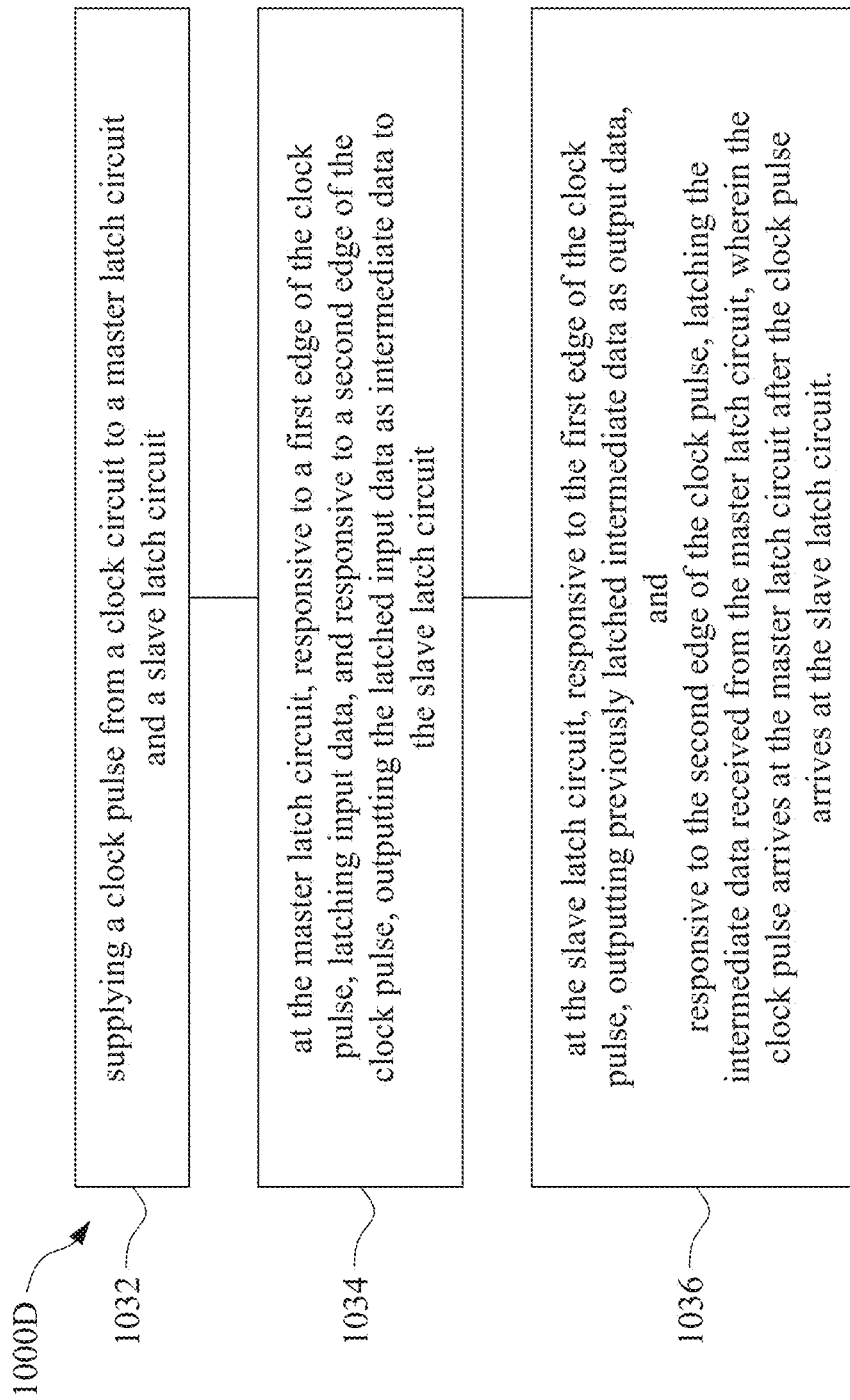

FIG. 10D is a flowchart of a method 1000D of operating a flip-flop circuit, in accordance with some embodiments. In some embodiments, the flip-flop circuit corresponds to the flip-flop circuit 200 described with respect to FIGS. 2A-2F.

At operation 1032, a clock pulse is supplied from a clock circuit to a master latch circuit and a slave latch circuit. For example, as described with respect to FIGS. 2A-2F, a clock pulse 270 is supplied from the clock circuit 230 to the master latch circuit 210 and slave latch circuit 220.

At operation 1034, at the master latch circuit, responsive to a first edge of the clock pulse, input data are latched, and responsive to a second edge of the clock pulse, the latched input data are output as intermediate data to the slave latch circuit. For example, as described with respect to FIGS. 2A-2F, responsive to a rising edge 271 of the clock pulse 270, the transmission gate TG1$m$ is turned ON (and the transmission gate TG2$m$ is turned OFF) to pass input data D to the data retention circuit 214 to be latched by the master latch circuit 210. Afterwards, responsive to a falling edge 272 of the clock pulse 270, the transmission gate TG2$m$ is turned ON (and the transmission gate TG1$m$ is turned OFF) to output the latched input data as intermediate data to the slave latch circuit 220.

At operation 1036, at the slave latch circuit, responsive to the first edge of the clock pulse, previously latched intermediate data are output as output data, and responsive to the second edge of the clock pulse, the intermediate data received from the master latch circuit are latched.

For example, as described with respect to FIGS. 2A-2F, responsive to the rising edge 271 of the clock pulse 270, the transmission gate TG2$s$ is turned ON (and the transmission gate TG1$s$ is turned OFF) to output previously latched intermediate data as output data at the output Q. Afterwards, responsive to the falling edge 272 of the clock pulse 270, the transmission gate TG1$s$ is turned ON (and the transmission gate TG2$s$ is turned OFF) to pass the intermediate data received from the master latch circuit 210 to the data retention circuit 224 for latching the received intermediate data therein.

The clock pulse arrives at the master latch circuit after the clock pulse arrives at the slave latch circuit. For example, as described with respect to FIGS. 2A-2F, the clock pulse 270 arrives at the master latch circuit 210 (the bottom section of FIG. 2C) after the arrival of the clock pulse 270 at the slave latch circuit 220 (similarly to the middle section of FIG. 2C). The later arrival of the clock pulse at the master latch circuit is caused by the greater time delay of the electrical connection over which the clock signal is supplied from the clock circuit to the master latch circuit. This arrangement, in at least one embodiment, reduces the setup time of the flip-flop circuit and improves performance, as described herein.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed herein is performed in whole or in part by at least one EDA system. In some embodiments, an EDA system is usable as part of a design house of an IC manufacturing system discussed below.

Figure 11:
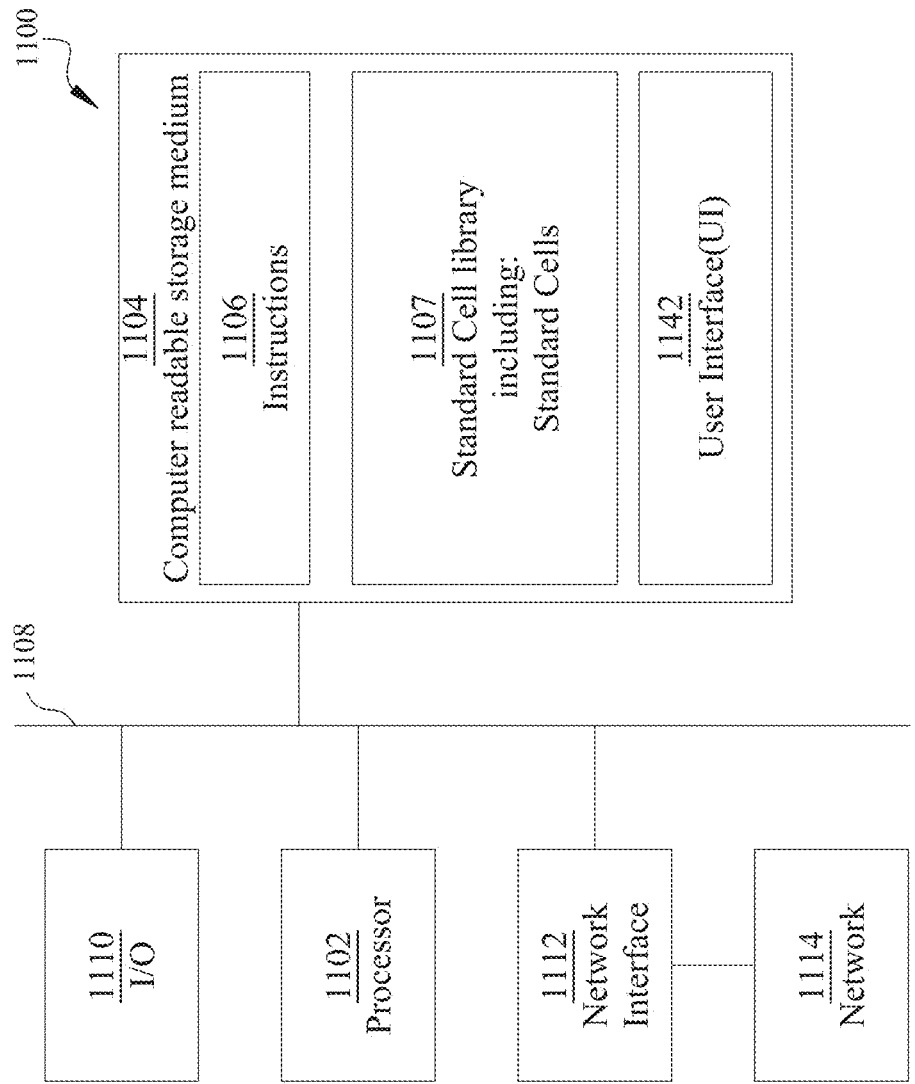
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 includes an APR system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102.

Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
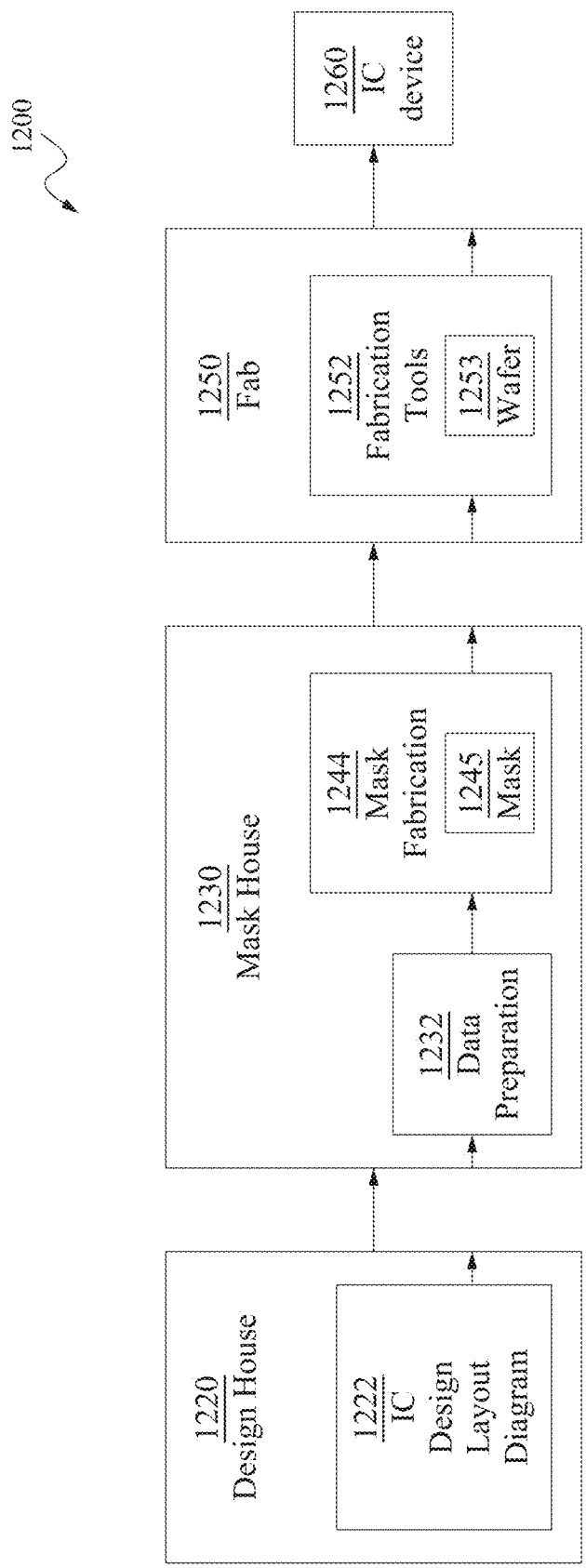
FIG. 12 is a block diagram of an IC device manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place-and-route operation. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

In an embodiment, an integrated circuit (IC) device comprises a master latch circuit comprising a data output, a slave latch circuit comprising a data input electrically coupled to the data output of the master latch circuit, and a clock circuit electrically coupled to the master latch circuit and the slave latch circuit. The slave latch circuit is physically between the master latch circuit and at least a part of the clock circuit.

In an embodiment, a system comprises at least one processor, and at least one memory that stores computer program code for one or more programs. When the at least one processor executes the computer program code stored in the at least one memory, the computer program code and the at least one processor are configured to cause the system to generate a layout of an IC device, the layout being stored on a non-transitory computer-readable medium. The generating the layout comprises: placing, in the layout, a master latch circuit, a slave latch circuit, and a clock circuit, and performing routing to electrically couple the clock circuit to the master latch circuit and the slave latch circuit. In said routing, instead of routing a first electrical connection from the clock circuit to the master latch circuit along an available shortest path for electrically coupling the clock circuit and the master latch circuit, the first electrical connection is routed along a path physically longer than the available shortest path.

In an embodiment, a method comprises: performing front-end-of-line (FEOL) processing to fabricate a plurality of transistors over a substrate, and performing back-end-of-line (BEOL) processing to fabricate a redistribution structure electrically coupling the plurality of transistors into a master latch circuit, a slave latch circuit, and a clock circuit. The redistribution structure comprises a conductive structure having opposite ends electrically coupled correspondingly to the master latch circuit and the clock circuit, and a midpoint between the opposite ends and electrically coupled to the slave latch circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
  a master latch circuit comprising a data output;
  a slave latch circuit comprising a data input electrically coupled to the data output of the master latch circuit; and
  a clock circuit electrically coupled to the master latch circuit and the slave latch circuit,
  wherein the slave latch circuit is physically between the master latch circuit and at least a part of the clock circuit.

2. The IC device of claim 1, further comprising:
  a first electrical connection electrically coupling the clock circuit to the master latch circuit; and
  a second electrical connection electrically coupling the clock circuit to the slave latch circuit, wherein
  the first electrical connection is physically longer than the second electrical connection.

3. The IC device of claim 1, wherein
  an entirety of the clock circuit is physically closer to the slave latch circuit than to the master latch circuit.

4. The IC device of claim 1, wherein
  the clock circuit comprises:
    a first clock output configured to output a first clock signal, and
    a second clock output configured to output a second clock signal, the second clock signal being inverted to the first clock signal,
  the first clock output is electrically coupled to a first clock input of the master latch circuit and a second clock input of the slave latch circuit correspondingly by a first electrical connection and a second electrical connection,
  the master latch circuit further comprises a third clock input electrically coupled to the second clock output by a third electrical connection, and
  the slave latch circuit further comprises a fourth clock input electrically coupled to the second clock output by a fourth electrical connection.

5. The IC device of claim 4, wherein
  at least one of
    the second electrical connection is a part of the first electrical connection, or
    the fourth electrical connection is a part of the third electrical connection.

6. The IC device of claim 4, wherein
  the clock circuit comprises:
    a first circuit having the first clock output, and configured to output the first clock signal at the first clock output, and
    a second circuit having the second clock output, and configured to output the second clock signal at the second clock output.

7. The IC device of claim 6, wherein
  the slave latch circuit is physically between the master latch circuit and the first circuit, and
  the first circuit is physically between the slave latch circuit and the second circuit.

8. The IC device of claim 6, wherein
  the first circuit is physically between the master latch circuit and the slave latch circuit, and
  the slave latch circuit is physically between the first circuit and the second circuit.

9. The IC device of claim 6, wherein
  the master latch circuit is physically between the first circuit and the slave latch circuit, and
  the slave latch circuit is physically between the master latch circuit and the second circuit.

10. The IC device of claim 6, further comprising:
  a fifth electrical connection electrically coupling the first circuit and the second circuit, and configured to transmit the first clock signal from the first circuit to the second circuit,
  wherein the fifth electrical connection physically extends across at least one of:
    the master latch circuit,
    the slave latch circuit, or
    a further circuit.

11. The IC device of claim 1, further comprising:
  a first electrical connection electrically coupling the clock circuit to the master latch circuit; and a second electrical connection electrically coupling the clock circuit to the slave latch circuit, wherein the first electrical connection comprises:
the second electrical connection physically extending from the clock circuit to the slave latch circuit, and
a third electrical connection serially electrically coupled to the second electrical connection, and physically extending from the slave latch circuit to the master latch circuit.

12. The IC device of claim 1, further comprising:
a plurality of master latch circuits including the master latch circuit;
a plurality of slave latch circuits including the slave latch circuit;
a first clock bus electrically coupling the clock circuit to the plurality of master latch circuits; and
a second clock bus electrically coupling the clock circuit to the plurality of slave latch circuits.

13. The IC device of claim 12, wherein
the plurality of master latch circuits and the plurality of slave latch circuits together configure a plurality of flip-flop circuits which are serially electrically coupled with each other, and
each slave latch circuit among the plurality of slave latch circuits has a data input electrically coupled to a data output of a corresponding master latch circuit among the plurality of master latch circuits, to form a corresponding flip-flop circuit among the plurality of flip-flop circuits.

14. The IC device of claim 12, wherein
the plurality of master latch circuits are physically arranged in a first column along a first direction,
the plurality of slave latch circuits are physically arranged in a second column along the first direction, and
in a second direction transverse to the first direction, the second column of the plurality of slave latch circuits is physically between the clock circuit and the first column of the plurality of master latch circuits.

15. The IC device of claim 14, further comprising:
a first electrical connection electrically coupling the clock circuit to the first clock bus; and
a second electrical connection electrically coupling the clock circuit to the second clock bus,
wherein
the first clock bus and the second clock bus extend along the first direction, and
the first electrical connection comprises:
the second electrical connection physically extending along the second direction from the clock circuit to the second clock bus, and
a third electrical connection serially electrically coupled to the second electrical connection, and physically extending along the second direction from the second clock bus to the first clock bus.

16. A system, comprising:
at least one processor; and
at least one memory that stores computer program code for one or more programs,
wherein, when the at least one processor executes the computer program code stored in the at least one memory, the computer program code and the at least one processor are configured to cause the system to perform generating a layout of an integrated circuit (IC) device, the layout being stored on a non-transitory computer-readable medium, the generating the layout comprising:
placing, in the layout, a master latch circuit, a slave latch circuit, and a clock circuit; and
performing routing to electrically couple the clock circuit to the master latch circuit and the slave latch circuit,
wherein, in said routing, instead of routing a first electrical connection from the clock circuit to the master latch circuit along an available shortest path for electrically coupling the clock circuit and the master latch circuit, the first electrical connection is routed along a path physically longer than the available shortest path.

17. The system of claim 16, wherein
said placing comprises placing at least a part of the clock circuit to be physically closer to the slave latch circuit than to the master latch circuit.

18. The system of claim 16, wherein
said placing comprises placing the master latch circuit physically closer to at least one part of the clock circuit than the slave latch circuit,
said routing comprises routing a second electrical connection from said at least one part of the clock circuit to the slave latch circuit, and
in said routing, the first electrical connection is routed from said at least one part of the clock circuit to the master latch circuit to be physically longer than the second electrical connection.

19. The system of claim 16, wherein
said placing comprises placing the clock circuit physically between the master latch circuit and the slave latch circuit,
said routing comprises routing a second electrical connection from the clock circuit to the slave latch circuit, and
in said routing, the first electrical connection is routed from the clock circuit to the master latch circuit to be physically longer than the second electrical connection.

20. An integrated circuit (IC) device, comprising:
a plurality of transistors over a substrate; and
a redistribution structure electrically coupling the plurality of transistors into a master latch circuit, a slave latch circuit, and a clock circuit,
wherein the redistribution structure comprises a conductive structure having
opposite ends electrically coupled correspondingly to the master latch circuit and the clock circuit, and
a midpoint between the opposite ends and electrically coupled to the slave latch circuit.

* * * * *